(12) United States Patent
Ema et al.

(10) Patent No.: US 8,980,710 B2
(45) Date of Patent: Mar. 17, 2015

(54) MANUFACTURING METHOD OF SEMICONDUCTOR DEVICE

(71) Applicant: Fujitsu Semiconductor Limited, Yokohama, Kanagawa (JP)

(72) Inventors: Taiji Ema, Inabe (JP); Mitsuaki Hori, Kuwana (JP); Kazushi Fujita, Kuwana (JP); Makoto Yasuda, Kuwana (JP); Katsuaki Ookoshi, kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/291,302

(22) Filed: May 30, 2014

(65) Prior Publication Data

US 2014/0377921 A1    Dec. 25, 2014

(30) Foreign Application Priority Data

Jun. 24, 2013   (JP) ................................. 2013-131642

(51) Int. Cl.
  *H01L 21/8247*   (2006.01)
  *H01L 27/115*    (2006.01)
  *H01L 29/10*     (2006.01)

(52) U.S. Cl.
  CPC ...... *H01L 27/11543* (2013.01); *H01L 29/1033* (2013.01)
  USPC ....................................................... 438/258

(58) Field of Classification Search
  USPC ............................................... 438/257–267
  See application file for complete search history.

(56) References Cited

U.S. PATENT DOCUMENTS 6,162,683 A * 12/2000 Chen .............................. 438/258
6,448,129 B1 * 9/2002 Cho et al. ....................... 438/241

(Continued)

FOREIGN PATENT DOCUMENTS

JP    2001-274154 A    10/2001
JP    2004-165197 A    6/2004

(Continued)

OTHER PUBLICATIONS

Lee et al.,"Anomalous Single Bit Retention Induced by Asymmetric STI-Corner-Thinning for Floating Gate Flash Memories", Proc. of Physical and Failure Analysis of Integrated Circuits, 2012, pp. 263-267, cited in the Specification.

(Continued)

*Primary Examiner* — Richard Booth
(74) *Attorney, Agent, or Firm* — Westerman, Hattori, Daniels & Adrian, LLP

(57) ABSTRACT

An impurity layer is formed in a first region of a semiconductor substrate, a silicon layer is grown on the semiconductor substrate, a tunnel gate insulating film is formed on a first silicon layer of a second region, a first conductor layer is formed on the tunnel gate insulating film, a first silicon oxide film and a silicon nitride film are formed on a second silicon layer, in a reduced pressure state, oxygen and hydrogen are independently introduced into an oxidation furnace to expose the silicon nitride film to active species of the oxygen and active species of the hydrogen to thereby oxidize the silicon nitride film to form a second silicon oxide film, a gate insulating film is formed on the silicon layer of the first region, a second conductor layer is formed on the second silicon oxide film and on the gate insulating film, the second conductor layer and the first conductor layer of the second region are patterned to form a stack gate of a nonvolatile memory transistor, and the second conductor layer above the first region is patterned to form a gate electrode of an MIS-type transistor.

15 Claims, 37 Drawing Sheets

(56) References Cited

U.S. PATENT DOCUMENTS

2002/0014700 A1 2/2002 Tokai et al.
2007/0072438 A1 3/2007 Joe

FOREIGN PATENT DOCUMENTS

| JP | 2005-5516 A | 1/2005 |
| JP | 2009-510769 A | 3/2009 |

OTHER PUBLICATIONS

Chimenton et al., "Drain-accelerated Degradation of Tunnel Oxides in Flash memories", IEEE IEDM Tech. Dig., 2002, pp. 6.7.1-6.7.4, cited in the Specification.

Ghidini, "Charge-related Phenomena and Reliability of Non-volatile Memories", Microelectronics Reliability, vol. 52, 2012, pp. 1876-1882, cited in the Specification.

* cited by examiner

FIG. 4

| | BL | DDC | flash on BL | flash on DDC |
|---|---|---|---|---|
| DDC implant | - | POR | - | POR |
| Blanket epi | - | 25nm | - | 35nm |
| STI | HT | LT | HT | LT |
| Flash TN-OX, FG & ONO | - | - | HT | LT |
| HV implant | - | - | POR | modify |
| MV implant | POR | POR | POR | POR |
| HV-GOX | - | - | HT | LT |
| MV-GOX | HT | LT | HT | LT |
| DDC-GOX | HT | LT | HT | LT |
| Gate poly | POR | POR | POR | POR |
| Flash CG | - | - | POR | POR |
| Flash SD | - | - | POR | modify |
| Flash SW-OX | - | - | HT | LT |
| HV/MV/DDC Gate | POR | POR | POR | POR |
| HV LDD | - | - | POR | modify |
| MV LDD | POR | POR | POR | POR |
| LV LDD | POR | POR | POR | POR |
| SW | POR | POR | POR | POR |
| SD | POR | POR | POR | POR |
| Silicide | POR | POR | POR | POR |
| BEOL | POR | POR | POR | POR |

MANUFACTURING METHOD OF SEMICONDUCTOR DEVICE

CROSS-REFERENCE TO RELATED APPLICATION

This application is based upon and claims the benefit of priority of the prior Japanese Patent Application No. 2013-131642, filed on Jun. 24, 2013, the entire contents of which are incorporated herein by reference.

FIELD

The embodiments discussed herein are directed to a manufacturing method of a semiconductor device.

BACKGROUND

With miniaturization high integration of a semiconductor device, variations in threshold voltage of a transistor caused by statistical fluctuations of channel impurities become obvious. The threshold voltage is one of the important parameters to determine the performance of a transistor, and for manufacturing a high-performance and highly reliable semiconductor device, it is important to reduce the variations in threshold voltage caused by statistical fluctuations of impurities.

As one of the techniques to reduce variations in threshold voltage caused by statistical fluctuations of impurities, a transistor structure called a DCC transistor (Deeply Depleted Channel transistor) has been proposed. The DDC transistor is one in which a non-doped epitaxial silicon layer is formed on a high-concentration channel impurity layer having a steep impurity concentration distribution.

On the other hand, a logic semiconductor device having a nonvolatile semiconductor memory mixedly mounted thereon creates product fields such as CPLD (Complex Programmable Logic Device) and FPGA (Field Programmable Gate Array), and results in creating a large market thanks to its programmable characteristic.

[Patent Document 1] Japanese Laid-open Patent Publication No. 2001-274154

[Parent Document 2] Japanese Laid-open Patent Publication No. 2004-165157

[Patent Document 3] Japanese Laid-open Patent Publication No. 2005-005516

[Patent Document 4] Japanese Translation of PCT Application No. 2009-510769

[Non-Patent Document 1] Ming-Yi Lee et al., "Anomalous Single Bit Retention Induced by Asymmetric STI-Corner-Thinning for Floating Gate Flash Memories", Proc. of Physical and Failure Analysis of Integrated Circuits, pp. 263-267, 2012

[Non-Patent Document 2] A. Chimenton et al., "Drain-accelerated Degradation of Tunnel Oxides in Flash memories", IEEE IEDM Tech. Dig., pp. 167-170, 2002

[Non-Patent Document 3] G. Ghidini, "Charge-related Phenomena and Reliability of Non-volatile Memories", Microelectronics Reliability Vol. 52, pp. 1876-1882, 2012

From now, it is also expected that a semiconductor device having a DDC transistor and a nonvolatile memory transistor mixedly mounted thereon is demanded. However, the DDC transistor and the nonvolatile memory transistor each have a unique manufacturing process, and the simple combination of both the processes makes it impossible to mixedly mount the transistors without deteriorating properties of these transistors.

SUMMARY

According to one aspect of the embodiment, there is provided a manufacturing method of a semiconductor device including: forming an impurity layer in a semiconductor substrate, that includes a first region and a second region, of the first region; epitaxially growing a silicon layer on the semiconductor substrate of the first region and the second region after forcing the impurity layer; forming a first silicon oxide film and a silicon nitride film above the semiconductor substrate after epitaxially growing the silicon layer; independently introducing oxygen and hydrogen into an oxidation furnace in a reduced pressure state and exposing the silicon nitride film to active species of the oxygen and active aperies of the hydrogen to oxidize the silicon nitride film to form a second silicon oxide film on the silicon nitride film; forming a first gate insulating film on the silicon layer of the first region; forming a first conductor layer on the second silicon oxide film and on the first gate insulating film; patterning the first conductor layer, the second silicon oxide film, the silicon nitride film, and the first silicon oxide film and forming a stack gate of a nonvolatile memory transistor above the second region; and patterning the first conductor layer above the first region and forming a gate electrode of an MIS-type transistor.

Further, according to another aspect of the embodiment, there is provided a manufacturing method of a semiconductor device including: forming an impurity layer in a semiconductor substrate, that includes a first region and a second region, of the first region; epitaxially growing a silicon layer on the semiconductor substrate of the first region and the second region after forming the impurity layer; forming a first silicon oxide film and a silicon nitride film above the semiconductor substrate after epitaxially growing the silicon layer; oxidizing the silicon nitride film at a temperature of 750° C. or lower and forming a second silicon oxide film on the silicon nitride film; forming a first gate insulating film on the silicon layer of the first region; forming a first conductor layer on the second silicon oxide film and on the first gate insulating film; patterning the first conductor layer, the second silicon oxide film, the silicon nitride film, and the first silicon oxide film and forming a stack gate of a nonvolatile memory transistor above the second region; and patterning the first conductor layer above the first region and forming a gate electrode of an MIS-type transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a view where representative steps of a normal logic process, a DDC process, a normal logic•flash mixedly mounted process, and a DDC•flash mixedly mounted process are compared;

DESCRIPTION OF EMBODIMENTS

Embodiment

A semiconductor device according to one embodiment and a manufacturing method thereof are explained by using FIG. 1 to FIG. 39.

Figure 1:
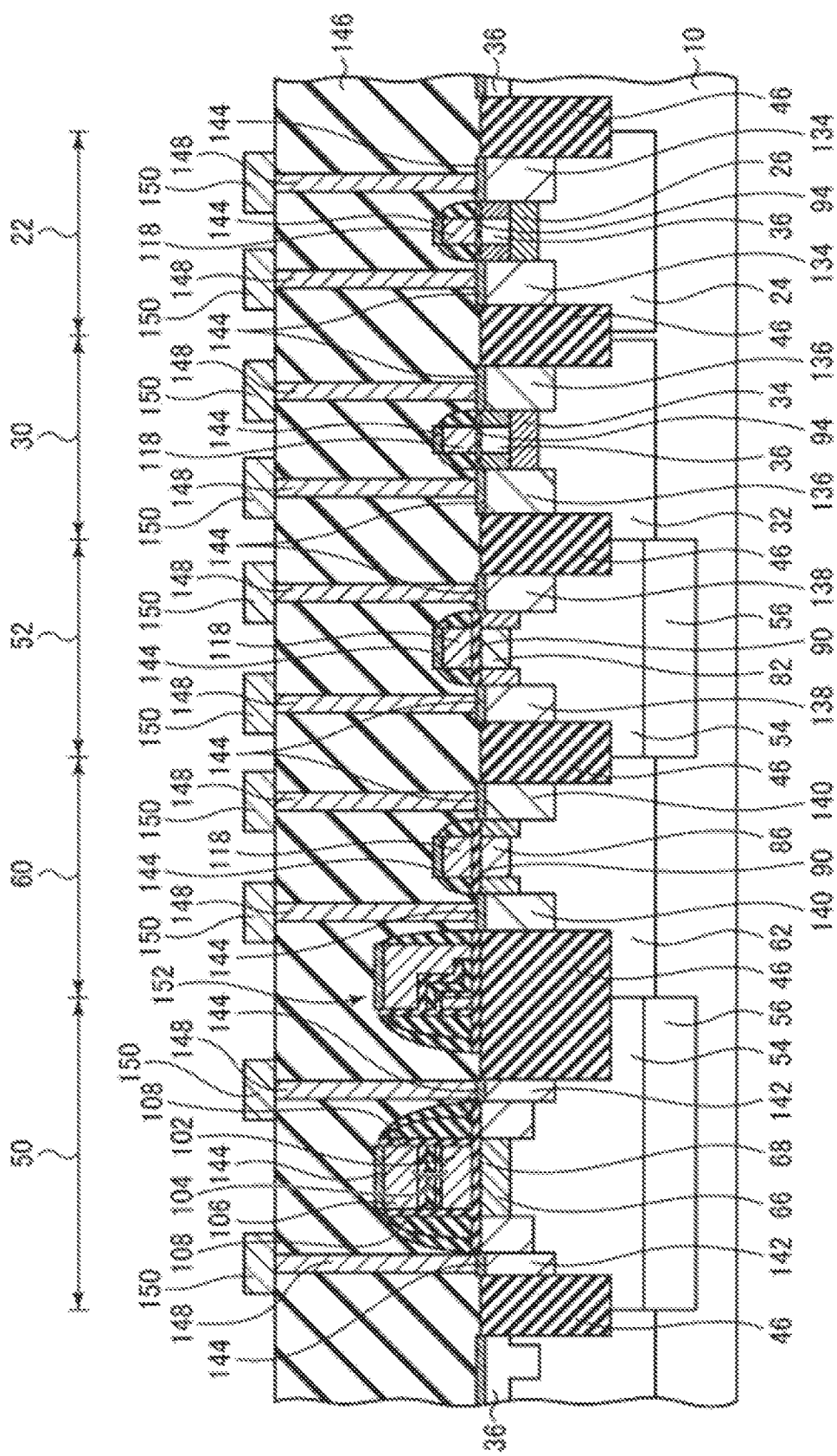
FIG. 1 is a schematic cross-sectional view illustrating a structure of a semiconductor device according to one example.
Figure 2:
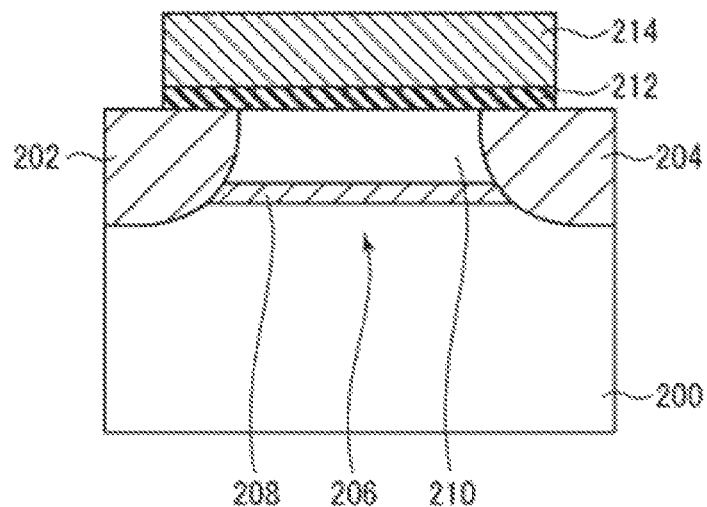
FIG. 2 is a schematic cross-sectional view illustrating a basic structure of a DDC transistor.
Figure 3:
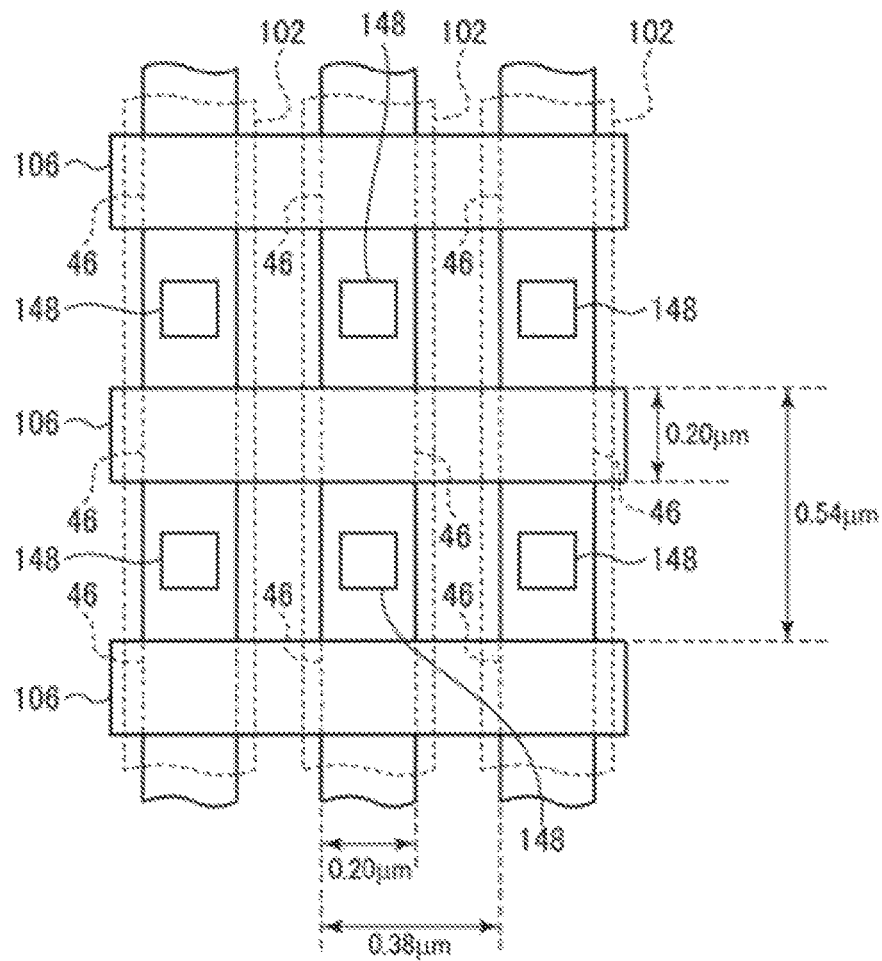
FIG. 3 is a plan view illustrating a structure of a flash memory transistor.
Figure 5:
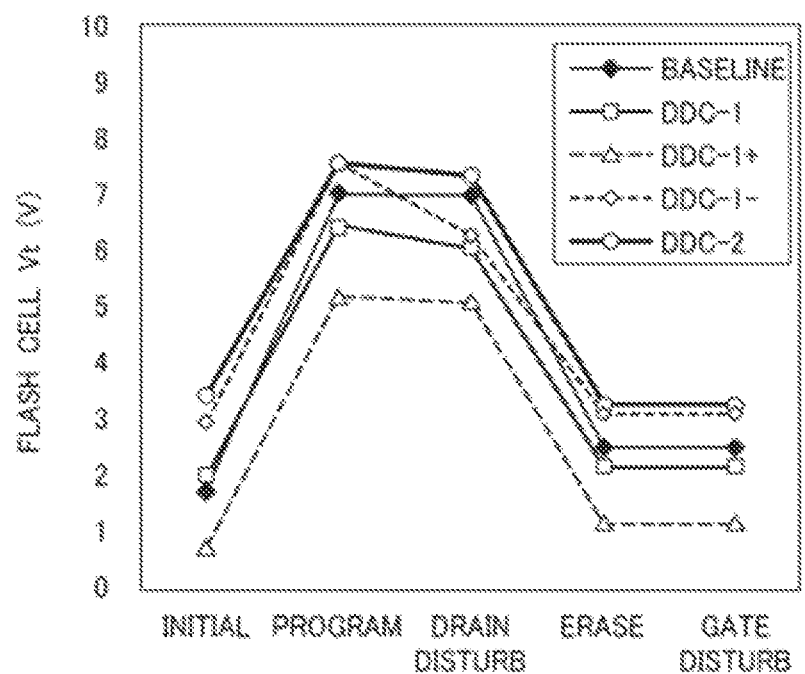
FIG. 5 is a graph illustrating changes in threshold voltage associated with driving of a flash memory transistor.
Figure 6:
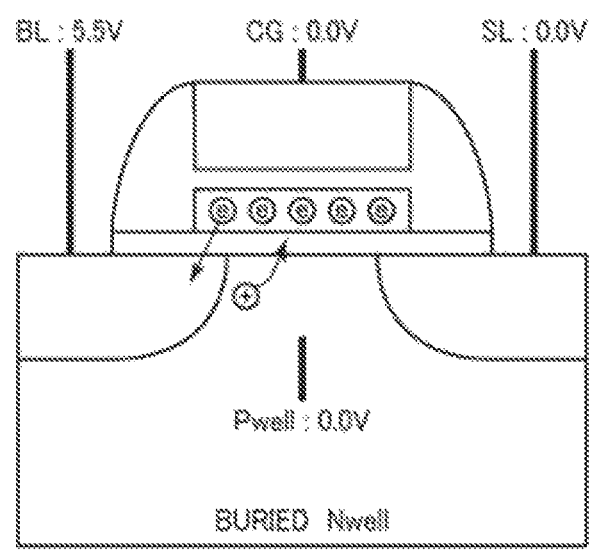
FIG. 6 is a view illustrating an application condition of a drain disturb stress.
Figure 7:
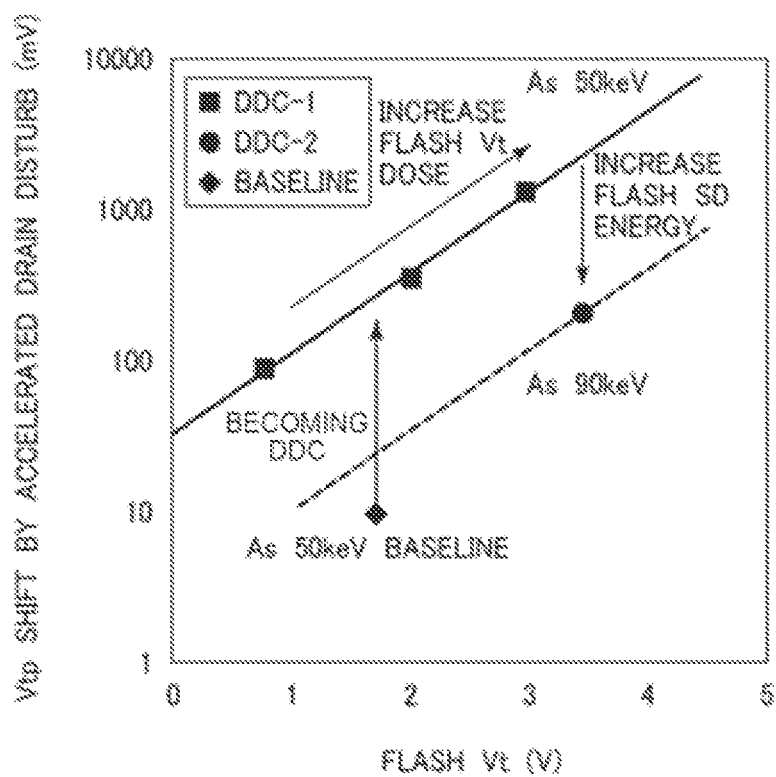
FIG. 7 is a graph illustrating the relationship between a change amount of threshold voltage by a drain disturb stress and the threshold voltage.
Figure 8:
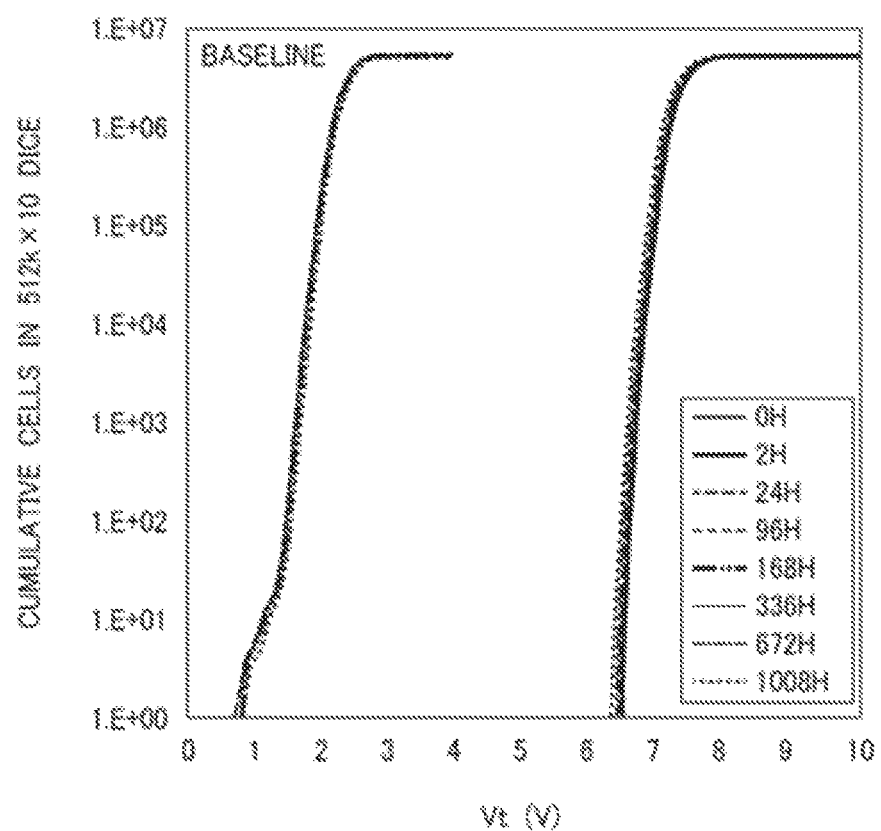
FIG. 8 is a graph illustrating results obtained by measuring a data retention property of a flash memory transistor (part 1)
Figure 9:
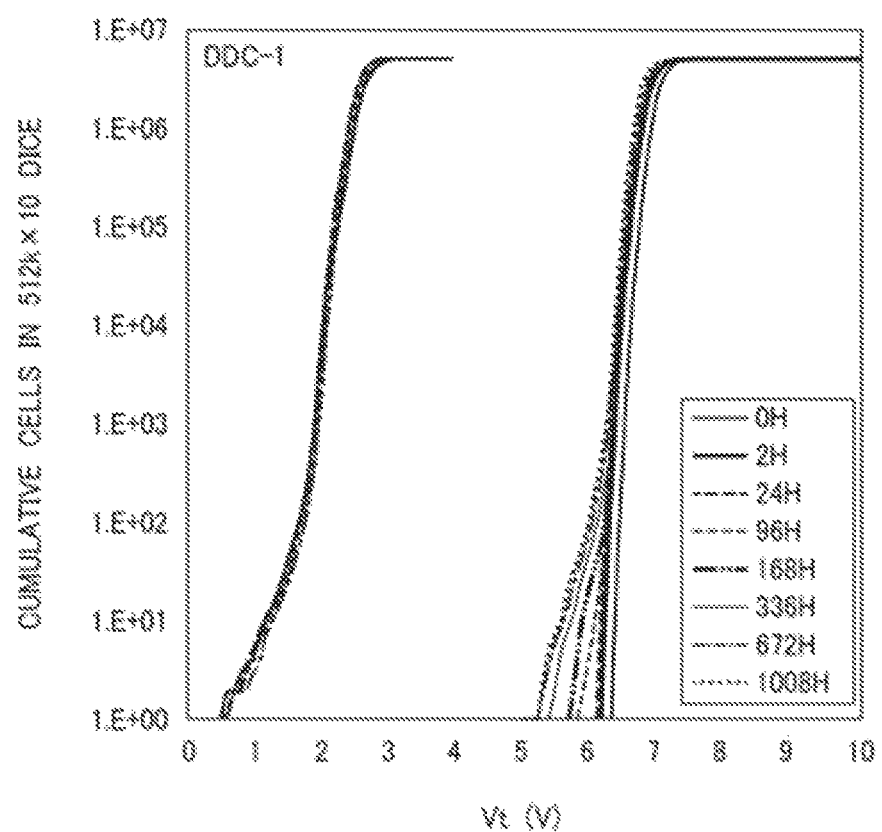
FIG. 9 is a graph illustrating results obtained by measuring a data retention property of a flash memory transistor (part 2)
Figure 10:
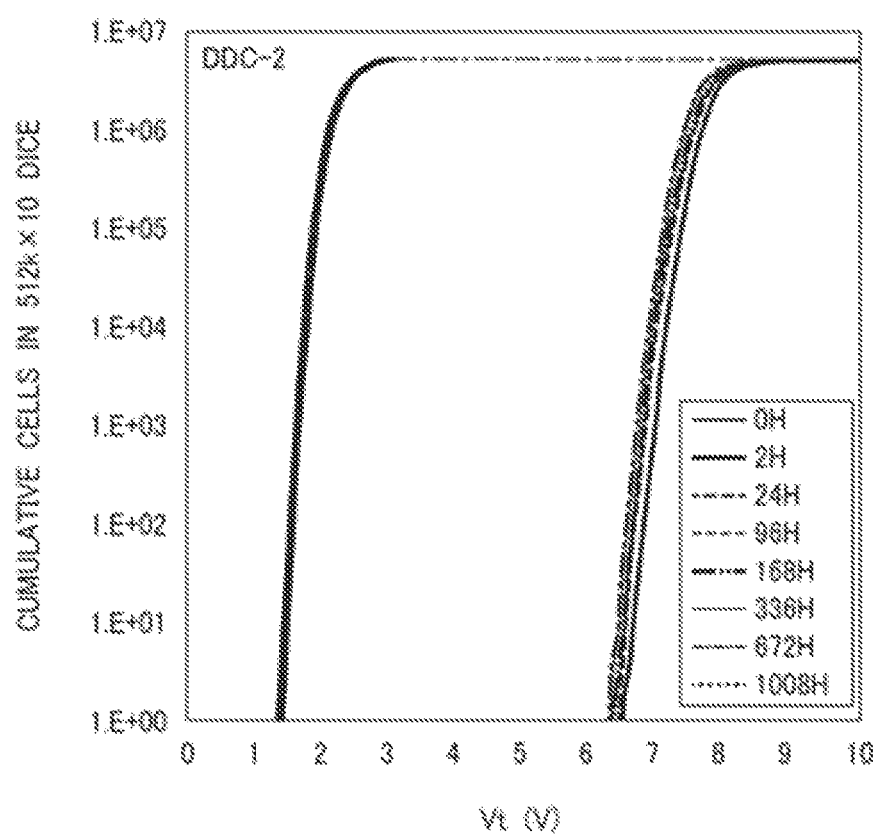
FIG. 10 is a graph illustrating results obtained by measuring a data retention property of a flash memory transistor (part 3)

FIG. 1 is a schematic cross-sectional view illustrating a structure of the semiconductor device according to this embodiment. FIG. 2 is a schematic cross-sectional view illustrating a basic structure of a DOC transistor. FIG. 3 is a plan view illustrating a structure of a flash memory transistor. FIG. 4 is a view where representative steps of a normal logic process, a DDC process, a normal logic•flash mixedly mounted process, and a DDC•flash mixedly mounted process are compared. FIG. 5 is a graph illustrating changes in threshold voltage associated with driving of a flash memory transistor. FIG. 6 is a view illustrating an application condition of a drain disturb stress. FIG. 7 is a graph illustrating the relationship between a change amount of threshold voltage by a drain disturb stress and the threshold voltage. FIG. 8 to FIG. 10 are graphs each illustrating results obtained by measuring a data retention property of a flash memory transistor. FIG. 11 to FIG. 39 are step cross-sectional views each illustrating the manufacturing method of the semiconductor device according to this embodiment.

First, the structure of the semiconductor device according to this embodiment is explained by using FIG. 1 and FIG. 2.

As illustrated in FIG. 1, on a silicon substrate 10, a DDC-NMOS transistor region 22, a DDC-PMOS transistor region 30, a high-voltage NMOS transistor region 52, a high-voltage PMOS transistor region 60, and a memory cell region 50 are provided. In each of the regions, an active region is demarcated by element isolation insulating films 46 buried in the silicon substrate 10, and in each active region, a predetermined transistor is formed.

Inside the silicon substrate 10 of the DDC-NMOS transistor region 22, a P well 24 and a P-type impurity layer 26 are formed. On the P-type impurity layer 26, an epitaxial silicon layer 36 is formed. On the epitaxial silicon layer 36, a gate insulating film 94 is formed. On the gate insulating film 94, a gate electrode 118 is formed. Inside the epitaxial silicon layer 36 and the silicon substrate 10 at both sides of the gate electrode 118, an N-type source/drain region 134 is formed. Thereby, in the DDC-NMOS transistor region 22, a DDC-NMOS transistor is formed.

Inside the silicon substrate 10 of the DDC-PMOS transistor region 30, an N well 32 and an N-type impurity layer 34 are formed. On the N-type impurity layer 34, an epitaxial silicon layer 36 is formed. On the epitaxial silicon layer 36, a gate insulating film 94 is formed. On the gate insulating film 94, a gate electrode 118 is formed. Inside the epitaxial silicon layer 36 and the silicon substrate 10 at both sides of the gate electrode 118, a P-type source/drain region 136 is formed. Thereby, in the DDC-PMOS transistor region 30, a DDC-PMOS transistor is formed.

The DDC-NMOS transistor and the DDC-PMOS transistor, as illustrated in FIG. 2, each have, in a channel region 206, a threshold voltage control layer 208 including a high-concentration impurity layer and a non-doped epitaxial layer 210 formed on the threshold voltage control layer 208. The threshold voltage control layer 208 corresponds to the P-type impurity layer 26 of the DDC-NMOS transistor and to the N-type impurity layer 34 of the DDC-PMOS transistor. Further, the epitaxial layer 210 corresponds to the epitaxial silicon layer 36 of the DDC-NMOS transistor and the DDC-PMOS transistor. The transistor having such a structure called a DDC transistor (Deeply Depleted Channel transistor) has a large effect of suppressing variations in threshold voltage caused by statistical fluctuations of impurities, and is effective for a high-speed transistor and the like at low-voltage operation to be used in a logic circuit and the like.

In the memory cell region 50, a P well 54 and a buried N well 56 provided under a bottom portion of the P well 54 are formed. A peripheral edge portion of the P well 54 is surrounded by an N well 62. Thereby, the P well 54 becomes a double well electrically isolated from other regions of the silicon substrate 10 by the buried N well 56 and the N well 62. In a surface portion of the P well 54, a P-type impurity layer 66 as a channel impurity layer is formed. Incidentally, also on the silicon substrate 10 of the memory cell region 50, an epitaxial silicon layer 36 is formed. The P-type impurity layer 66 is formed in a surface portion of a substrate obtained by the epitaxial silicon layer 36 being stacked on the silicon substrate 10. On this substrate, there is formed a gate stack structure made by a tunnel gate insulating film 68, a floating gate 102, an ONO film 104, and a control gate 106 being stacked sequentially. Inside the substrate at both sides of a gate electrode 118, an N-type source/drain region 142 is formed. Thereby, in the memory cell region 50, a nonvolatile memory transistor in a stack gate structure (a flash memory transistor) is formed.

In FIG. 1, the single flash memory transistor is illustrated, but in the memory cell region 50, plural flash memory transistors are formed in a matrix.

FIG. 3 is a plan view illustrating one example of a layout of the flash memory transistors in the memory cell region 50.

The control gate 106 doubling as a word line is not particularly limited, but has a line width of 0.20 µm, for example and is arranged repeatedly at a pitch of 0.54 µm. Further, the element isolation insulating film 46 is not particularly limited, but is formed in such a manner that the active region having a width of 0.20 µm is arranged at a pitch of 0.38 µm.

In the high-voltage NMOS transistor region 52, a P well 54 and a buried N well 56 provided under a bottom portion of the P well 54 are formed. A peripheral edge portion of the P well 54 is surrounded by the N wall 62. Thereby, the P well 54 becomes a double well electrically isolated from other regions of the silicon substrate 10 by the buried N well 56 and the N well 62. In a surface portion of the P well 54, a P-type impurity layer 82 as a channel impurity layer is formed. Incidentally, also on the silicon substrate 10 of the high-voltage NMOS transistor region 52, an epitaxial silicon layer 36 is formed. The P-type impurity layer 82 is formed in a surface portion of a substrate obtained by the epitaxial silicon layer 36 being stacked on the silicon substrate 10. On this substrate, a gate insulating film 90 is formed. On the gate insulating film 90, a gate electrode 118 is formed. Inside the substrate at both sides of the gate electrode 118, an N-type source/drain region 138 is formed. Thereby, in the high-voltage NMOS transistor region 52, a high-voltage NMOS transistor is formed.

In the high-voltage PMOS transistor region 60, the N well 62 is formed. In a surface portion of the N well 62, an N-type impurity layer 86 as a channel impurity layer is formed. Incidentally, also on the silicon substrate 10 of the high-voltage PMOS transistor region 60, an epitaxial silicon layer 36 is formed. The N-type impurity layer 86 is formed in a surface portion of a substrate obtained by the epitaxial silicon layer 36 being stacked on the silicon substrate 10. On this substrate, a gate insulating film 90 is formed. On the gate insulating film 90, a gate electrode 118 is formed. Inside the substrate at both sides of the gate electrode 118, a P-type source/drain region 140 is formed. Thereby, in the high-voltage PMOS transistor region 60, a high-voltage PMOS transistor is formed.

The high-voltage NMOS transistor and the high-voltage PMOS transistor are a high-withstand-voltage transistor to be used at programming•erasing operations of the memory transistor.

On the gate electrodes 118 of the respective transistors, on the control gate 106, on the N-type source/drain regions 134, 138, and 142, and on the P-type source/drain regions 136 and 140, a metal silicide film 144 is formed.

On the substrate where the transistors are formed, an interlayer insulating film 146 is formed. In the interlayer insulating film 146, contact plugs 148 connected to respective terminals of the transistors are buried. Wirings 150 are connected to the contact plugs 148.

Incidentally, in FIG. 1, a structure 152 illustrated between the flash memory transistor and the high-voltage PMOS transistor remains in a peripheral edge portion of the memory cell region 50 when the flash memory transistor and the peripheral transistor are manufactured individually.

As described above, the semiconductor device according to this embodiment is one in which the DDC transistors constituting logic circuits and the like, the flash memory transistors, and the high-voltage transistors used for driving the flash memory transistors are mixedly mounted on the single silicon substrate.

Next, the problem caused when the DDC transistor and the flash memory transistor are mixedly mounted is explained in comparison with the case where not the DDC transistor but a normal logic transistor and the flash memory transistor are mixedly mounted.

FIG. 4 is a view where representative steps of a normal logic process (BL), a DDC process (DDC), a normal logic•flash mixedly mounted process (flash on BL), and a DDC•flash mixedly mounted process (flash on DDC) are compared.

In FIG. 4, "DDC implant" means an ion implantation step for forming a threshold voltage control layer of a DDC transistor. "Blanket epi" means a film forming step for forming an epitaxial layer of a DDC transistor. "STI" means a series of steps for forming an element isolation insulating film. "Flash TN-OX, FG & ONO" means a series of film forming steps for forming a tunnel gate insulating film, a floating gate, an ONO film, and the like of a flash memory transistor. "HV implant" means an ion implantation step for high-voltage transistors. "MV implant" means an ion implantation step for 3.3 V operation transistors (to be called medium-voltage transistors, hereinafter) to be used for I/O. "HV-GOX" means a thermal oxidation step for forming a gate insulating film of a high-voltage transistor. "MV-GOX" means a thermal oxidation step for forming a gate insulating film of a medium-voltage transistor. "DDC-GOX" means a thermal oxidation step for forming a gate insulating film of a low-voltage transistor. "Gate poly" means a film forming step of a polysilicon film to be a gate electrode and a control gate. "Flash CG" means a forming step of a control gate. "Flash SD" means a forming step of a source/drain region of a flash memory transistor. "Flash SW-OX" means a thermal oxidation step for forming a sidewall oxide film of a gate stack. "HV/MV/DDC Gate" means a forming step of a gate electrode. "HV LDD" means an ion implantation step for forming an LDD region of a high-voltage transistor. "MV LDD" means an ion implantation step for forming an LDD region of a medium-voltage transistor. "LV LDD" means an ion implantation step for forming an LDD region of a low-voltage transistor. "SW" means a forming step of a sidewall insulating film. "SD" means an ion implantation step for forming a source/drain region. "Silicide" means a forming step of a silicide film by a silicide process. "BEOL" means a series of back-end processes. Further, "HT" represents high temperature (High temperature), and "LT" represents low temperature (Low Temperature). Further, "POR" represents a predetermined condition (Process of Record).

In a normal flash mixedly mounted logic process flow (flash on BL), as illustrated in FIG. 4, most of the steps peculiar to the flash memory transistor such as forming a tunnel gate insulating film and an ONO film are completed prior to the forming step of the logic transistor. Therefore, it is not necessary to perform these steps at low temperature. Further, the step of forming a sidewall oxide film (Flash SW-OX) also somewhat affects a channel profile of the logic transistor, but does not affect an effective channel length because of being completed prior to the LDD formation, resulting in that the necessity for a decrease in temperature is small.

On the other hand, in the case where the DDC transistor and the flash memory transistor are mixedly mounted, the step of forming a threshold voltage control layer and the step of growing an epitaxial layer are newly needed, but these steps are performed prior to the steps peculiar to the above-described flash memory transistor.

However, the steps peculiar to the flash memory transistor are performed at relatively high temperature in order to improve insulating film reliability, and the like. For example, for forming the tunnel gate insulating film, thermal oxidation at 1000° C. to 1050° C. or so is used. Further, for forming a top oxide film of the ONO film, forming the gate insulating film of the high-voltage transistor, and forming the sidewall insulating film, thermal oxidation at 950° C. or so is used. Therefore, when these steps are incorporated into the process of the DDC transistor as they are, diffusion of an impurity to form the threshold voltage control layer is promoted to make it impossible to form the DDC transistor having desired properties.

Thus, in order to mixedly mount the DDC transistor and the flash memory transistor, it is necessary to apply a new method that has not been applied to manufacture of the flash memory transistor so far and to form the flash memory transistor under conditions not affecting properties of the DDC transistor.

In view of this, in the manufacturing method of the semiconductor device according to this embodiment, the above-described thermal steps peculiar to the flash memory transistor are performed under a low-temperature condition of about 750° C. or lower that has a small effect on properties of the DDC transistor.

Concretely, formations of the tunnel gate insulating film 68 and the gate insulating film 90 (a silicon oxide film 90a) of the high-voltage transistors are performed by atmospheric pressure wet oxidation at about 750° C. or lower. The atmospheric pressure wet oxidation is a method in which in an atmospheric pressure state, oxygen and hydrogen are made to react with each other outside an oxidation furnace to then be introduced into the above oxidation furnace and thermal oxidation is performed.

Further, formations of the top oxide film of the ONO film 104 (a silicon oxide film 78) and the sidewall oxide film (a silicon oxide film 108) are performed by thermal oxidation by a LPRO (Low Pressure Radical Oxidation) method at a temperature of about 750° C. or lower with the use of a batch-type oxidation furnace. The LPRO method is a method in which under reduced pressure (under pressure lower than atmospheric pressure), oxygen and hydrogen are independently supplied into an oxidation furnace tube set to a predetermined temperature and by using active molecules•atoms of the oxygen and the hydrogen, oxidation is performed. The reason for using the batch-type oxidation furnace is because a long time is needed for the oxidation at low temperature by the LPRO method. However, the reason why the thermal oxidation by the LPRO method is performed in a batch processing manner is to consider a processing time, and has no intention to eliminate performing the thermal oxidation by the LPRO method in a single-wafer processing manner.

The LPRO method makes it possible to decrease the temperature of thermal oxidation, but makes gas supply into the oxidation furnace tube complicated in the batch-type oxidation furnace, so that film thickness distribution in the oxidation furnace tube becomes worse than in the atmospheric pressure oxidation case. Therefore, for the formations of the tunnel gate insulating film 68 and the gate insulating film 90 (silicon oxide film 90a) of the high-voltage transistors that need high-precision film thickness control, the wet oxidation having high film thickness controllability is desirably used.

On the other hand, the top oxide film of the ONO film 104 (silicon oxide film 78) is formed by oxidation of a silicon nitride film 76 having high oxidation resistance, and for controlling the thermal oxidation to thermal oxidation capable of maintaining properties of the DDC transistor, the thermal oxidation by the LPRO method using active species is desired. Further, for the formation of the sidewall oxide film (silicon oxide film 108), the thermal oxidation by the LPRO method is desired in view of suppressing a bird's beak to occur in the stack gate. This is because when for the formation of the sidewall oxide film (sidewall oxide film 108), the atmospheric pressure wet oxidation at low temperature similar to the case of the tunnel gate insulating film 68 and the gate insulating film 90 of the high-voltage transistors is used, the bird's beak to occur in the stack gave increases. Here, the bird's beak means that a portion different in thickness occurs in an oxide film formed by thermal oxidation or the like.

The thermal oxidation by the LPRO method is used for the formation of the sidewall oxide film (silicon oxide film 108 in FIG. 1), thereby making it possible to suppress a bird's beak to occur in side surfaces of the stack gate.

As a result of examination performed by the present inventor and the like, it was found that high-precision film thickness control necessary for the tunnel gate insulating film 68 and the gate insulating film 90 (silicon oxide film 90a) of the high-voltage transistors is not needed for the formations of the top oxide film of the ONO film 104 and the sidewall oxide film.

Incidentally, in view of preventing local film thinning of the tunnel gate insulating film at corner portions of the element isolation insulating film to improve properties of the flash memory transistor, there is reported that a structure in which corner portions of the element isolation insulating film are rounded is effective. In view of this, it is also conceivable that the formation of the tunnel gate insulating film is desirably performed at high temperature. However, in the flash memory transistor formed by the manufacturing method of the semiconductor device according to this embodiment, a data retention property equal to that of the normal logic mixedly mounted flash memory transistor can be achieved as will be described later.

As a result that the present inventor and the like examined the effect on the DDC transistor when the above-described thermal steps peculiar to the flash memory transistor were performed under the above-described low-temperature condition, it was possible to confirm than the DDC transistor having satisfactory properties is obtained.

Next, there are described results obtained after the present inventor and the like examined the effect on the flash memory transistor caused by performing the thermal steps peculiar to the flash memory transistor at low temperature.

FIG. 5 is a graph illustrating changes in threshold voltage of the flash memory transistor. In the drawing, the plot of ♦ mark indicates the result of a normal logic mixedly mounted flash memory transistor, and the plots of □ mark, ∆ mark, ◇ mark, and ○ mark indicate the result of DDC mixedly mounted flash memory transistors.

The flash memory transistors indicated by □ mark, ∆ mark, and ◇ mark are different in ion implantation dose amount for threshold voltage control. That is, the ion implantation dose amount is increased in order of □ mark, ∆ mark, and ◇ mark.

The flash memory transistor indicated by ○ mark is one in which source/drain regions (N-type impurity layers 112) are formed under an ion implantation condition of an acceleration energy higher than that of the flash memory transistors indicated by □ mark, ∆ mark, and ◇ mark. That is, in the flash memory transistors indicated by □ mark, ∆ mark, and ◇ mark, the source/drain regions are formed under a condition of As$^+$ 50 keV 6×10$^{14}$ cm$^{-2}$, but in the flash memory transistor indicated by ○ mark, the source/drain regions are formed under a condition of As$^+$ 90 keV 6×10$^{14}$ cm$^{-2}$.

The horizontal axis in FIG. 5 indicates measurement results of the threshold voltage obtained at an initial state (INITIAL), after programming (PROGRAM), after a drain disturb stress (DRAIN DISTURB), after erasing (ERASE), and after a gate disturb stress (GATE DISTURB) in order from the left. Drain disturb stress application is performed by applying 5.5 V to a drain terminal (bit line: BL) and applying 0 V to the other terminals (source terminal: SL, control gate: CG, P well: P well, buried N well: BURIED N well) as illustrated in FIG. 6. Gate disturb stress application is performed by applying 10 V to a gate terminal and applying 0 V to the other terminals.

As illustrated in FIG. 5, in the normal logic mixedly mounted flash memory transistor, a shift amount of the threshold voltage after the drain disturb stress application is small, but in the DDC mixedly mounted flash memory transistors, a shift amount of the threshold voltage after the drain disturb stress application is large. From this result, in the DDC mixedly mounted flash memory transistors, drain disturb resistance decreases and a state where charge loss occurs is seen.

FIG. 7 is a graph obtained by rewriting the measurement results in FIG. 5 to the relationship between the change amount of the threshold voltage by the drain disturb stress and the threshold voltage. In the drawing, the plot of ♦ mark indicates a result of the normal logic mixedly mounted flash memory transistor, and the plots of 570 mark and ● mark indicate results of the DDC mixedly mounted flash memory transistors. In the flash memory transistor indicated by ■ mark, the source/drain regions are formed under the condition of As$^+$ 50 keV 6×10$^{14}$ cm$^{-2}$, but in the flash memory transistor indicated by ● mark, the source/drain regions are formed under the condition of As$^+$ 90 keV 6×10$^{14}$ cm$^{-2}$.

As a cause of the occurrence of charge loss, there are conceived two mechanisms: extraction of an electron from the floating gate to the drain terminal; and injection of a hole of an electron-hole pair generated by a P well-to-drain electric field into the floating gate (see FIG. 6). The degraded immunity of the DDC mixedly mounted flash memory transistor to drain disturb is conceived to be caused mainly by the latter out of these.

That is, as illustrated by the plot of ■ mark in FIG. 7, in the DDC mixedly mounted flash memory transistor, as the ion implantation dose amount for the threshold voltage control increases, the change amount of the threshold voltage becomes larger. The increase in ion implantation dose amount means an increase in P well concentration, to thereby make the P well-to-drain electric field steep, and thereby it is conceivable that the injection of a hole into the floating gate is increased.

Thus, it is conceivable that the P well-to-drain electric field is made graded, thereby making it possible to improve the drain disturb resistance also in the DDC mixedly mounted flash memory transistor.

It is inferred that the reason why the change amount of the threshold voltage becomes small in the flash memory transistor indicated by ● mark illustrated in FIG. 7 is because the P well-to-drain electric field is just becomes graded.

That is, the flash memory transistor indicated by ● mark is one in which the source/drain regions are formed under the ion implantation condition of an acceleration energy higher than that of the flash memory transistor indicated by ■ mark. It is conceivable that the source/drain regions are formed under the ion implantation condition of a high acceleration energy, and thereby the concentration of impurity in the drain region in the vicinity of the surface of the substrate decreases and the P well-to-drain electric field becomes graded.

When the change amount of the threshold voltage is extrapolated from properties of the flash memory transistor indicated by ● mark based on an inclination of the change amount of the threshold voltage in the flash memory transistor indicated by ■ mark, the result indicated by a dotted line in FIG. 7 is obtained. From this result, it is possible to predict that the source/drain regions are formed under the ion implantation condition of a high acceleration energy, thereby making it possible to suppress the change amount of the threshold voltage to a value close to that of the normal logic mixedly mounted flash memory transistor.

From these, it is conceivable that also in the DDC mixedly mounted flash memory transistor, impurity profiles of a channel region and source/drain diffusion layers are controlled appropriately, thereby making it possible to improve the drain disturb resistance.

FIG. 8 to FIG. 10 are graphs each illustrating results obtained by measuring a data retention property of a flash memory transistor. They are results obtained after programming and erasing of 512 k pieces of flash memory transistors of 10 chips were repeated 1000 times and then the threshold voltage was measured every predetermined time. FIG. 8 is the case of a normal logic mixedly mounted flash memory transistor, and FIG. 9 and FIG. 10 each are the case of a DDC mixedly mounted flash memory transistor. The flash memory transistor in FIG. 9 is one in which source/drain regions are formed under a condition of $As^+$ 50 keV $6\times10^{14}$ $cm^{-2}$, and the flash memory transistor in FIG. 10 is one in which source/drain regions are formed under a condition of $As^+$ 90 keV $6\times10^{14}$ $cm^{-2}$.

As illustrated in FIG. 9, in the flash memory transistor having had the source/drain regions formed therein under the ion implantation condition of a low acceleration energy, as an elapsed time increases, a bit having a decreased threshold voltage in a program state increases, and the bottom of distribution extends to the side of the low threshold voltage. This phenomenon is called single bit charge loss, and is said to be closely related to the quality of the tunnel gate insulating film and the roundness of the STI (element isolation insulating film) corners.

In contrast to this, as illustrated in FIG. 10, in the flash memory transistor having had the source/drain regions formed therein under the ion implantation condition of a high acceleration energy, the change in the threshold voltage accompanied by an increase in elapsed time is hardly seen, and the data retention property equivalent to that of the normal logic mixedly mounted flash memory transistor illustrated in FIG. 8 can be achieved.

From the above results, it is possible to confirm that the insulating film reliability equal to that of the normal logic mixedly mounted flash memory transistor can be obtained even though the thermal oxidation steps peculiar to the flash memory transistor are performed at low temperature and the roundness of the STI corners is made small, unlike the prediction pointed out by Documents and the like.

Next, the manufacturing method of the semiconductor device according to this embodiment is explained by using FIG. 11 to FIG. 39.

First, on a silicon substrate 10, there is formed a photoresist film 12 having an opening portion 14 in a region where a trench 16 to be a mark for mask alignment is formed. The opening portion 14 is formed in, for example, a scribe region other than a product-to-be-formed-region of the silicon substrate 10.

Figure 11:
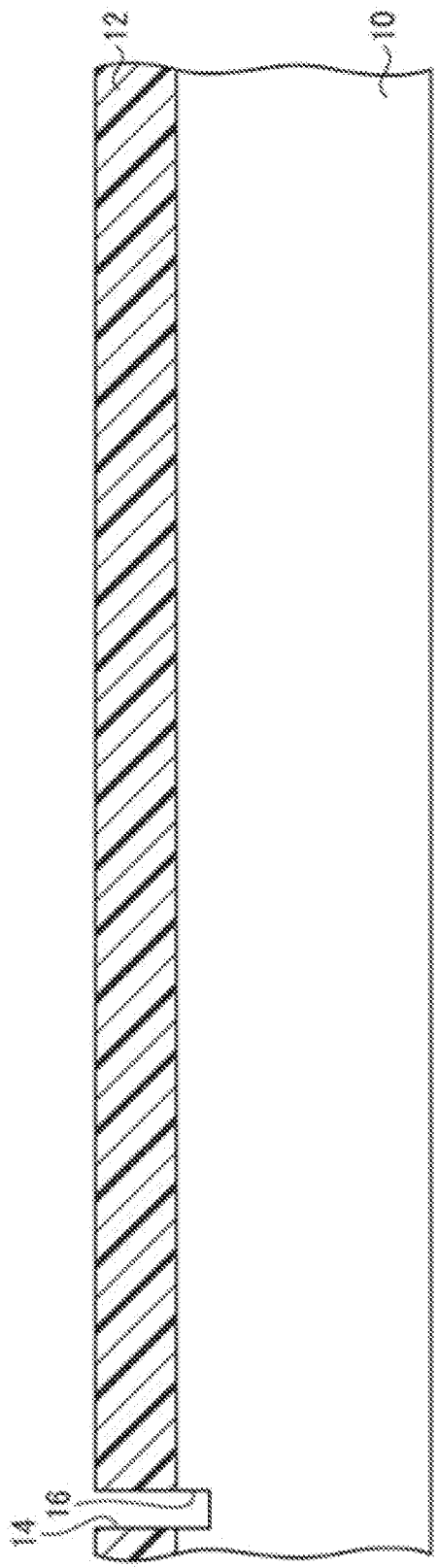
FIG. 11 is a step cross-sectional view illustrating a manufacturing method of the semiconductor device according to one embodiment (part 1)

Next, the silicon substrate is etched by using the photoresist film 12 as a mask, and in the silicon substrate 10 inside the opening portion 14, the trench 16 is formed (FIG. 11).

In the manufacturing method of the semiconductor device according to this embodiment, wells and channel impurity layers are formed before forming element isolation insulating films 46. The trench 16 is used as a mark for mask alignment in a photolithography step (for forming wells and channel impurity layers, and the like) to be performed before forming the element isolation insulating films 46.

Next, by ashing, for example, the photoresist film 12 is removed.

Next, on the whole surface of the silicon substrate 10, a silicon oxide film 18 as a protective film of the surface of the silicon substrate 10 is formed by a thermal oxidation method, for example.

Next, by photolithography, a photoresist film 20 exposing a DDC-NMOS transistor region 22 and covering the other regions is formed. For alignment of the photolithography, the mark of the trench 16 is used.

Figure 12:
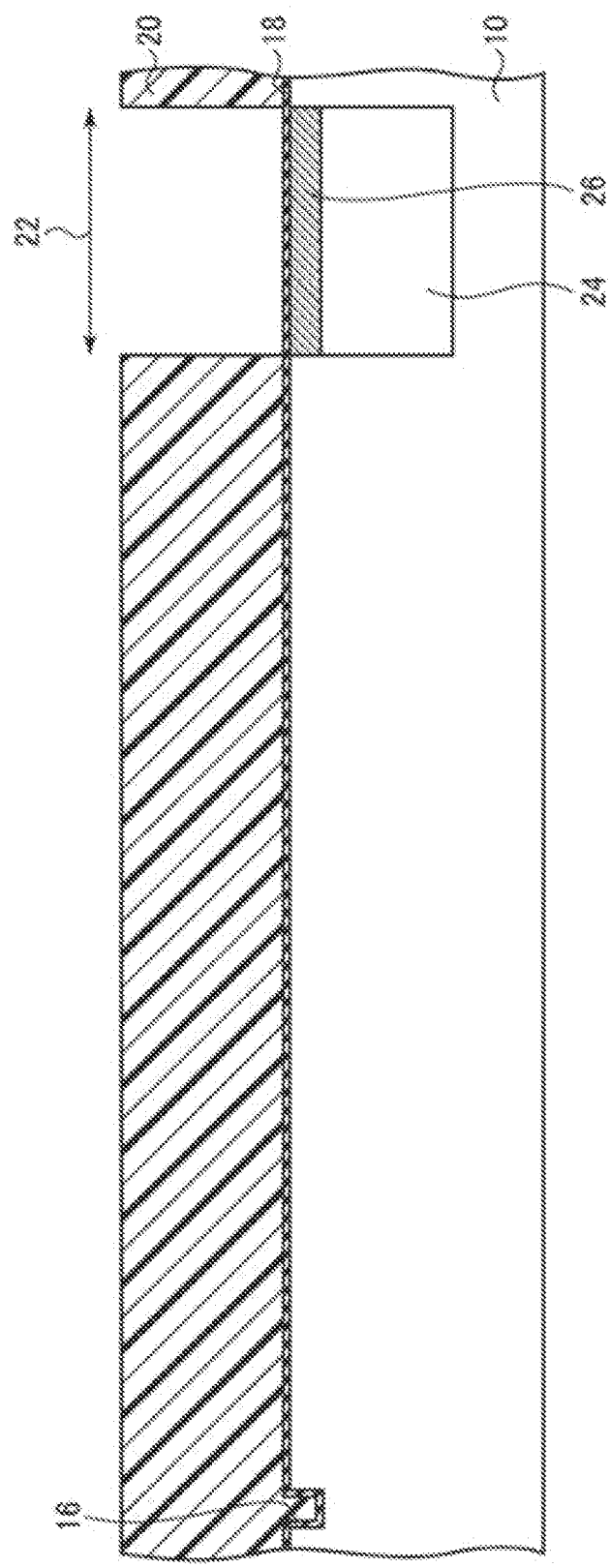
FIG. 12 is a step cross-sectional view illustrating the manufacturing method of the semiconductor device according to one embodiment (part 2)

Next, by using the photoresist film 20 as a mask, ion implantation is performed, and in the DDC-NMOS transistor region 22, a P well 24 and a P-type impurity layer 26 to be a channel impurity layer of a DDC-NMOS transistor are formed (FIG. 12).

The P well 24 is formed in a manner that, for example, boron ions ($B^+$) are ion-implanted from each of four directions inclined relative to the direction normal to the substrate under a condition of an acceleration energy of 150 keV and a dose amount of $7.5\times10^{12}$ $cm^{-2}$. The P-type impurity layer 26 is formed in a manner that, for example, germanium ions ($Ge^+$) are ion-implanted under a condition of an acceleration energy of 30 keV and a dose amount of $5\times10^{14}$ $cm^{-2}$, carbon ions ($C^+$) are ion-implanted under a condition of an acceleration energy of 5 keV and a dose amount of $5\times10^{14}$ $cm^{-2}$, boron ions are ion-implanted under a condition of an acceleration energy of 20 keV and a dose amount of $1.8\times10^{13}$ $cm^{-2}$, and boron fluoride ions ($BF_2^+$) are ion-implanted under a condition of an acceleration energy of 25 keV and a dose amount of $6\times10^{12}$ $cm^{-2}$ and a condition of an acceleration energy of 10 keV and a dose amount of $3\times10^{12}$ $cm^{-2}$. The germanium makes the silicon substrate 10 amorphous to prevent channeling of the boron ions, and makes the silicon substrate 10 amorphous to act to increase the probability of the carbon being provided at lattice points. The carbon provided at lattice points acts to suppress diffusion of the boron. In view of this, germanium is ion-planted earlier than carbon and boron. The P well 24 is desirably formed earlier than the P-type high-concentration impurity layer 26.

Next, by ashing, for example, the photoresist film 20 is removed.

Next, on the surface of the silicon substrate 10, a silicon oxide film 19 having a film thickness of 3 nm, for example, is formed by an ISSG (in-situ steam generation) oxidation method at 810° C., for example.

Next, by photolithography, a photoresist film 28 exposing a DDC-PMOS transistor region 30 and covering the other regions is formed. The mark of the trench 16 is used for alignment of the photolithography.

Figure 13:
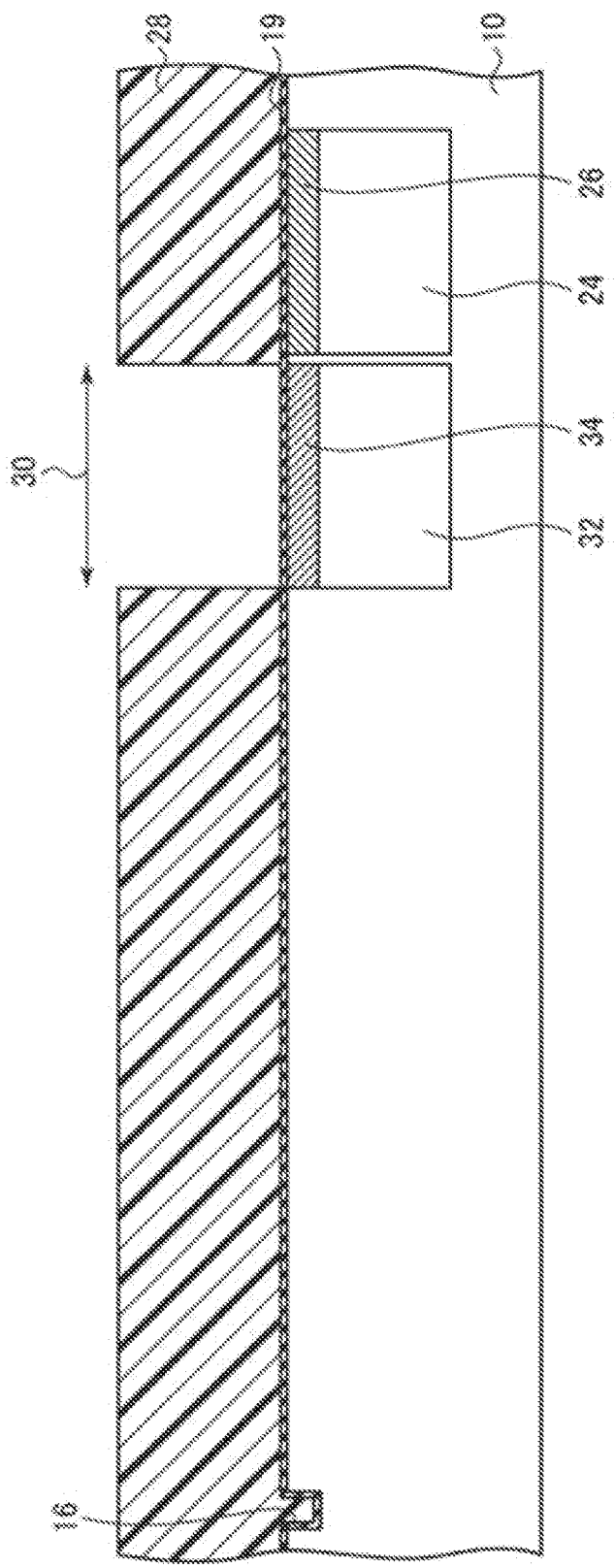
FIG. 13 is a step cross-sectional view illustrating the manufacturing method of the semiconductor device according to one embodiment (part 3)

Next, by using the photoresist film 28 as a mask, ion implantation is performed, and in the DDC-PMOS transistor region 30, an H well 32 and an N-type impurity layer 34 to be a channel impurity layer of a DDC-PMOS transistor are formed (FIG. 13).

The N well 32 is formed in a manner that, for example, phosphorous ions ($P^+$) are ion-implanted from each of four directions inclined relative to the direction normal to the substrate under a condition of an acceleration energy of 360 keV and a dose amount of $7.5\times10^{12}$ $cm^{-2}$ and antimony ions ($Sb^+$) are ion-implanted under a condition of an acceleration energy of 80 keV and a dose amount of $1.2\times10^{13}$ $cm^{-2}$ and a condition of an acceleration energy of 130 keV and a dose amount of $6\times10^{12}$ $cm^{-2}$. The N-type impurity layer 34 is formed in a manner that, for example, antimony ions are ion-implanted under a condition of an acceleration energy of 20 keV and a dose amount of $6\times10^{12}$ $cm^{-2}$.

Next, by ashing, for example, the photoresist film 28 is removed.

Incidentally, the case where two kinds of DDC transistors are formed is described here, but when a DDC transistor different in threshold voltage and a DDC transistor different in withstand voltage are further formed, the similar processes are performed repeatedly, or ion implantation for threshold voltage control is only added, to thereby form predetermined wells and impurity layers to be channel regions.

Next, in an inert gas atmosphere, thermal processing is performed to recover damage of the ion implantations introduced into the silicon substrate 10 and to activate the implanted impurities. For example, in a nitrogen atmosphere, thermal processing at 600° C. for 150 seconds is performed.

Next, by wet etching using a hydrofluoric acid aqueous solution, for example, the silicon oxide film 19 is removed.

Next, by an ISSG (in-situ steam generation) oxidation method at 810° C., for example, a silicon oxide film having a film thickness of 3 nm, for example, is grown to be removed by wet etching using a hydrofluoric acid aqueous solution. In this manner, a region containing knock-on oxygen on the silicon surface that has occurred at the time of ion implantation is removed.

Figure 14:
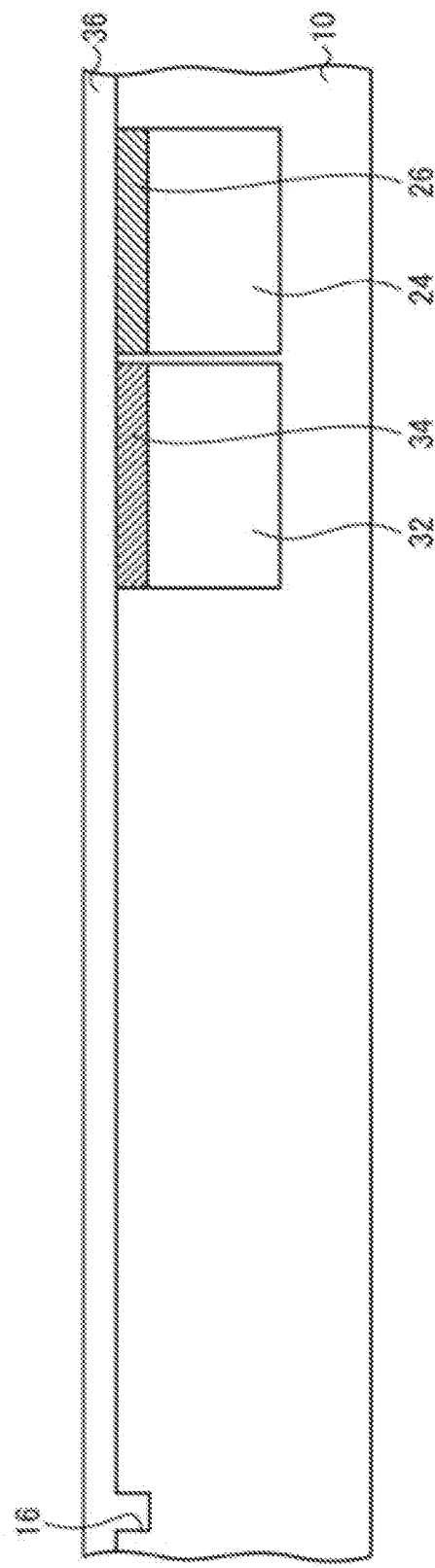
FIG. 14 is a step cross-sectional view illustrating the manufacturing method of the semiconductor device according to one embodiment (part 4)

Next, by a CVD method, for example, on the surface of the silicon substrate 10, a non-doped silicon layer (epitaxial silicon layer) 36 having a film thickness of 35 nm, for example, is epitaxially grown (FIG. 14).

Incidentally, in the process of the DDC transistor that is not mixedly mounted with the flash memory, an epitaxial silicon layer having a film thickness of 25 nm, for example, is grown. The reason why the film thickness of the epitaxial silicon layer 36 is made thick in the manufacturing method of the semiconductor device according to this embodiment is to consider film thinning of the epitaxial silicon layer 36 caused by the oxidation steps and the like peculiar to the flash memory mixedly mounted process.

Next, by an ISSG method, for example, under reduced pressure, the surface of the epitaxial silicon layer 36 is wet-oxidized to form a silicon oxide film 38 having a film thickness of 3 nm, for example. Its processing condition is set that a temperature is 810° C. and a time is 20 seconds, for example. Here, the processing time of this wet oxidation is 20 seconds, which is a short time, so that an effect of fluctuations of the threshold voltage of the DDC transistor is in an ignorable range.

Next, on the silicon oxide film 38, by a low-pressure CVD method, for example, a silicon nitride film 40 having a film thickness of 80 nm, for example, is deposited. Its processing condition is set that a temperature is 700° C. and a time is 150 minutes, for example.

Next, by photolithography, on the silicon nitride film 40, a photoresist film 42 exposing element isolation regions is formed. The mark of the trench 16 is used for alignment of the photolithography.

Figure 15:
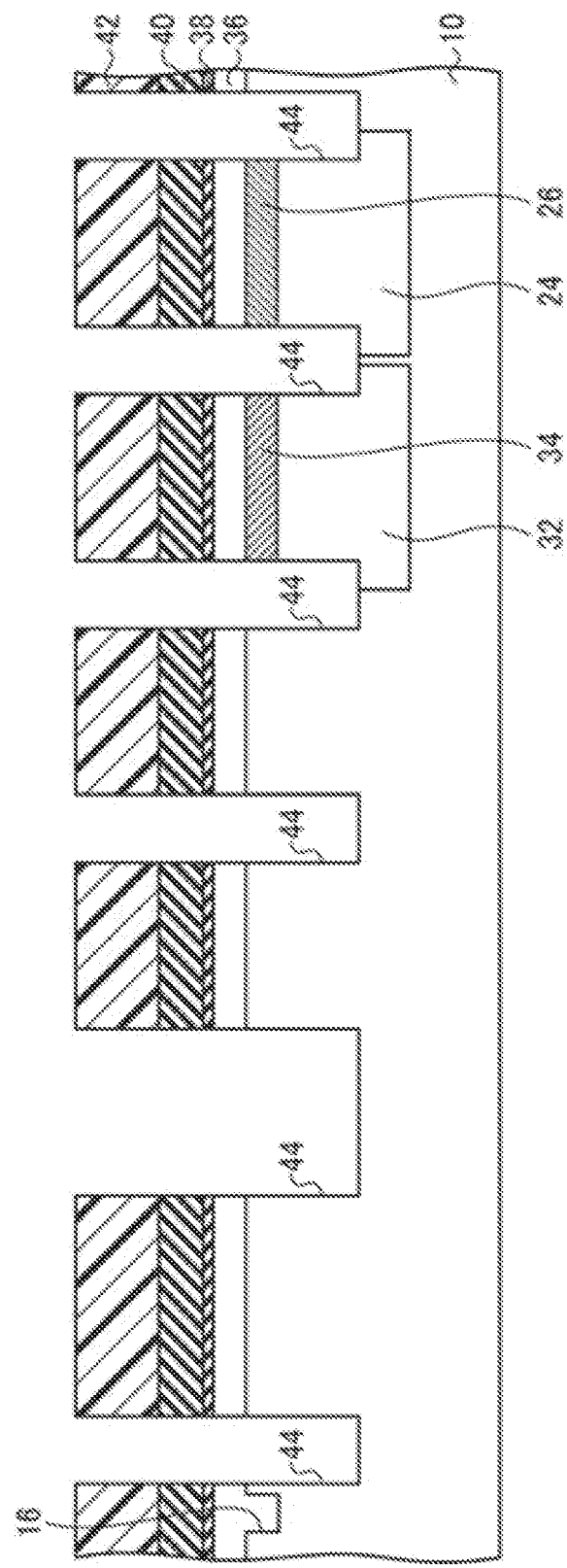
FIG. 15 is a step cross-sectional view illustrating the manufacturing method of the semiconductor device according to one embodiment (part 5)

Next, by using the photoresist film 42 as a mask, the silicon nitride film 40, the silicon oxide film 38, the epitaxial silicon layer 36, and the silicon substrate 10 are anisotropically etched by dry etching. Thereby, an element isolation trench 44 is formed in the element isolation regions containing regions between the respective transistor regions, (FIG. 15).

Next, by a LPRO method, the surfaces of the epitaxial silicon layer 36 and the silicon substrate 10 are oxidized to form as a liner film a silicon oxide film having a film thickness of 10 nm, for example, on inner walls of the element isolation trenches 44. Its oxidation condition is set that, for example, a temperature is 650° C., an oxygen flow rate is 7 slm, a hydrogen flow rate is 3 slm, a pressure is 0.95 torr, and a time is 125 minutes. According to the LPRO method, the formation of the silicon oxide film at low temperature such as at about 750° C. or lower becomes possible.

However, the LPRO method makes gas supply into an oxidation furnace tube complicated, so that film thickness distribution in the oxidation furnace tube becomes worse than in the case of atmospheric pressure oxidation. In results of trial manufacture by the present inventor and the like, in-furnace distribution of 0.2 nm to 0.3 nm or so was confirmed with respect to the formation of a film having a film thickness of 10 nm. The value of this in-furnace distribution is about two to three times of that in the case of atmospheric pressure oxidation being used.

For the liner film, high-precise film thickness control is unnecessary, so that it is possible to achieve the decrease in the oxidation temperature by using a LPRO method.

Next, by a high-density plasma CVD method, for example, a silicon oxide film having a film thickness of 500 nm, for example, is deposited and the element isolation trenches 44 are filled with the silicon oxide film.

Figure 16:
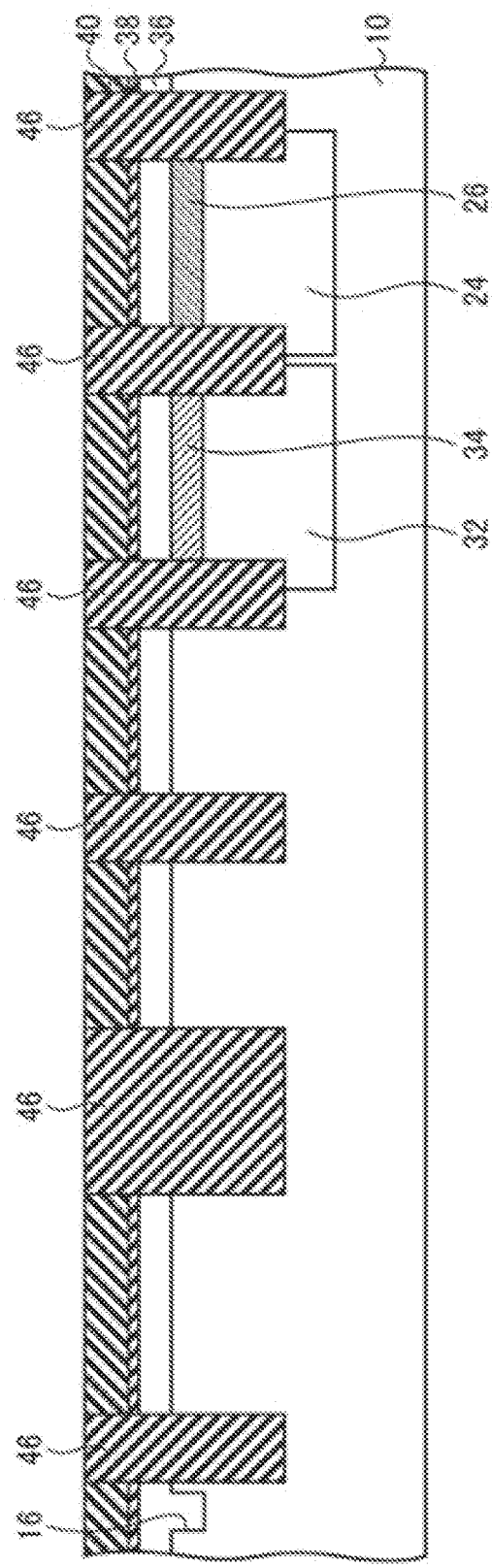
FIG. 16 is a step cross-sectional view illustrating the manufacturing method of the semiconductor device according to one embodiment (part 6)

Next, by a CMP (Chemical Mechanical Polishing) method, for example, the silicon oxide film on the silicon nitride film 40 is removed. In this manner, by what is called a STI (Shallow Trench Isolation) method, the element isolation insulating films 46 are formed with the silicon oxide film filled in the element isolation trenches 44 (FIG. 16).

Next, by using the silicon nitride film 40 as a mask, the element isolation insulating films 46 are etched by about 30 nm, for example, by wet etching using a hydrofluoric acid aqueous solution, for example. This etching is to adjust the surface of the epitaxial silicon layer 36 and the surfaces of the element isolation insulating films 46 to be nearly the same height in the completed transistors.

Figure 17:
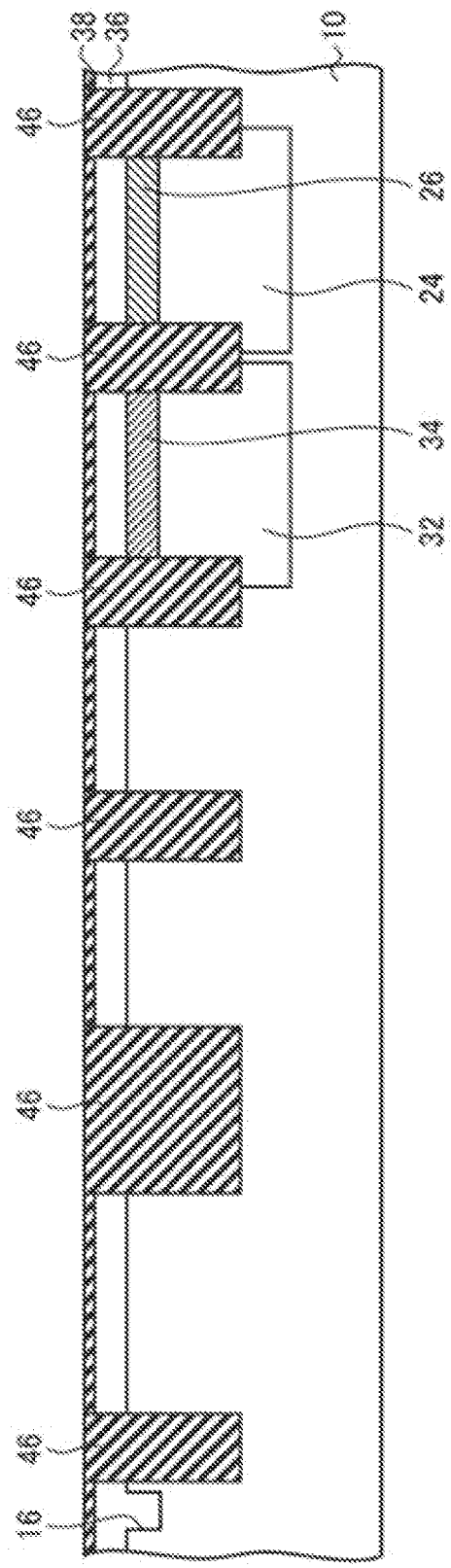
FIG. 17 is a step cross-sectional view illustrating the manufacturing method of the semiconductor device according to one embodiment (part 7)

Next, by wet etching using hot phosphoric acid, for example, the silicon nitride film 40 is removed (FIG. 17).

Next, by photolithography, a photoresist film 48 exposing a memory cell region 50 and a high-voltage NMOS transistor region 52 is formed.

Figure 18:
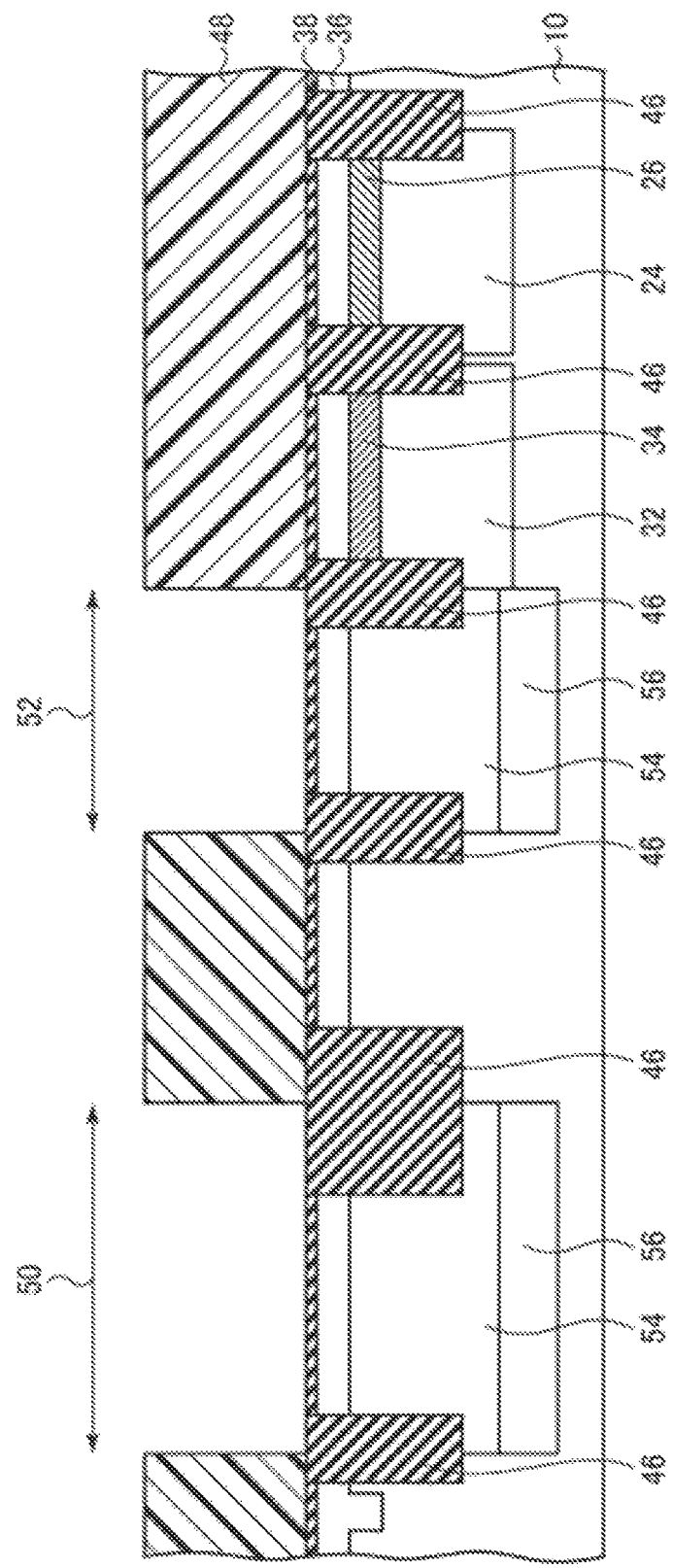
FIG. 18 is a step cross-sectional view illustrating the manufacturing method of the semiconductor device according to one embodiment (part 8)

Next, by using the photoresist film 48 as a mask, ion implantation is performed to form a P well 54 and a buried N well 56 in the memory cell region 50 and the high-voltage NMOS transistor region 52 (FIG. 18).

The P wells 54 are formed in a manner that, for example, boron ions are ion-implanted under a condition of an acceleration energy of 420 keV and a dose amount of $1.4 \times 10^{13}$ $cm^{-2}$ and a condition of an acceleration energy of 150 keV and a dose amount of $1.6 \times 10^{12}$ $cm^{-2}$. Further, the buried N wells 56 are formed in a manner that, for example, phosphorus ions are ion-implanted under a condition of an acceleration energy of 2 MeV and a dose amount of $2 \times 10^{13}$ $cm^{-2}$.

Next, by ashing, for example, the photoresist film 48 is removed.

Next, by photolithography, a photoresist film 58 exposing a high-voltage PMOS transistor region 60 is formed.

Figure 19:
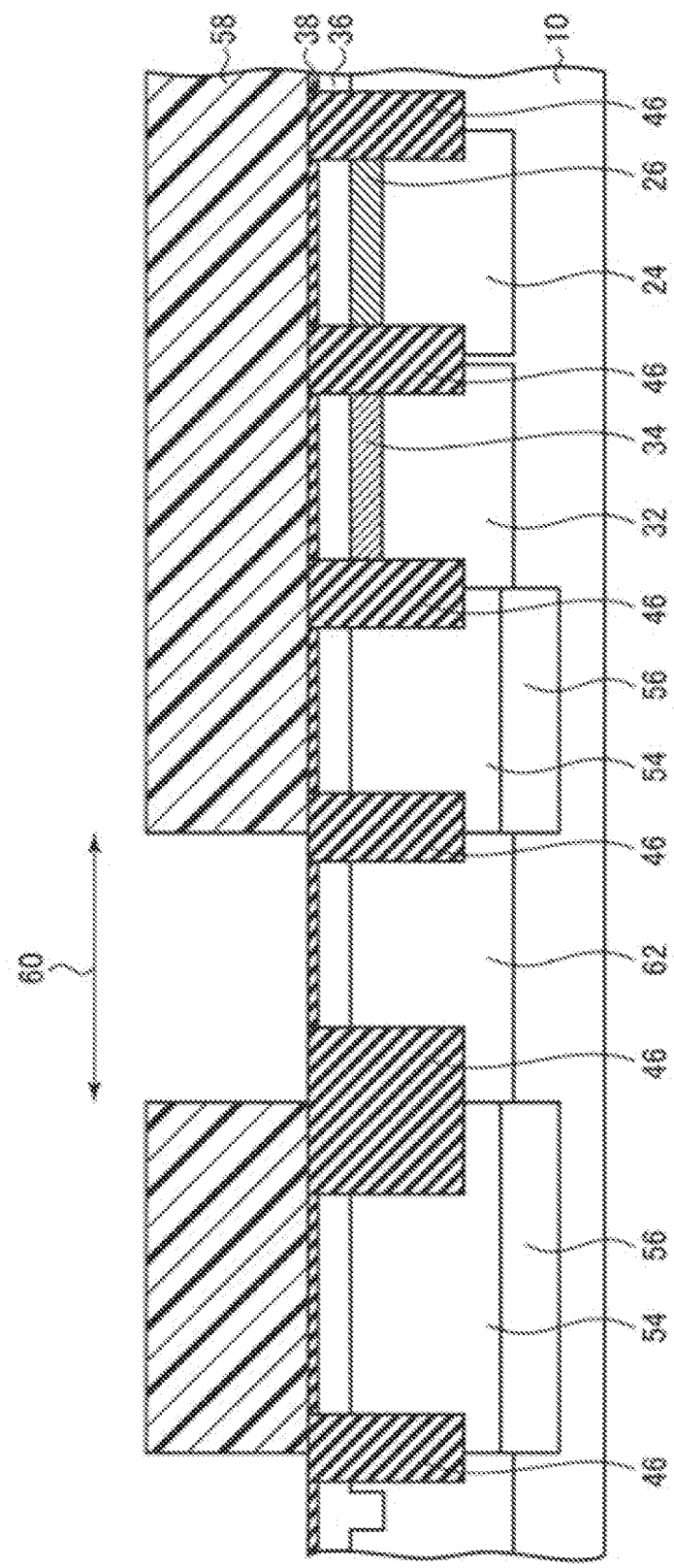
FIG. 19 is a step cross-sectional view illustrating the manufacturing method of the semiconductor device according to one embodiment (part 9)

Next, by using the photoresist film 58 as a mask, ion implantation is performed to form an N well 62 in the high-voltage PMOS transistor region 60 (FIG. 19). The N well 62 is formed in a manner that, for example, phosphorus ions are ion-implanted under a condition of an acceleration energy of 480 keV and a dose amount of $2.9 \times 10^{12}$ $cm^{-2}$.

Incidentally, the P wells 54 each thereby become a double well surrounded by the N well 62 and the buried N well 56, (which may also be the N well 32).

Next, by ashing, for example, the photoresist film 58 is removed.

Next, by photolithography, a photoresist film 64 exposing the memory cell region 50 is formed.

Figure 20:
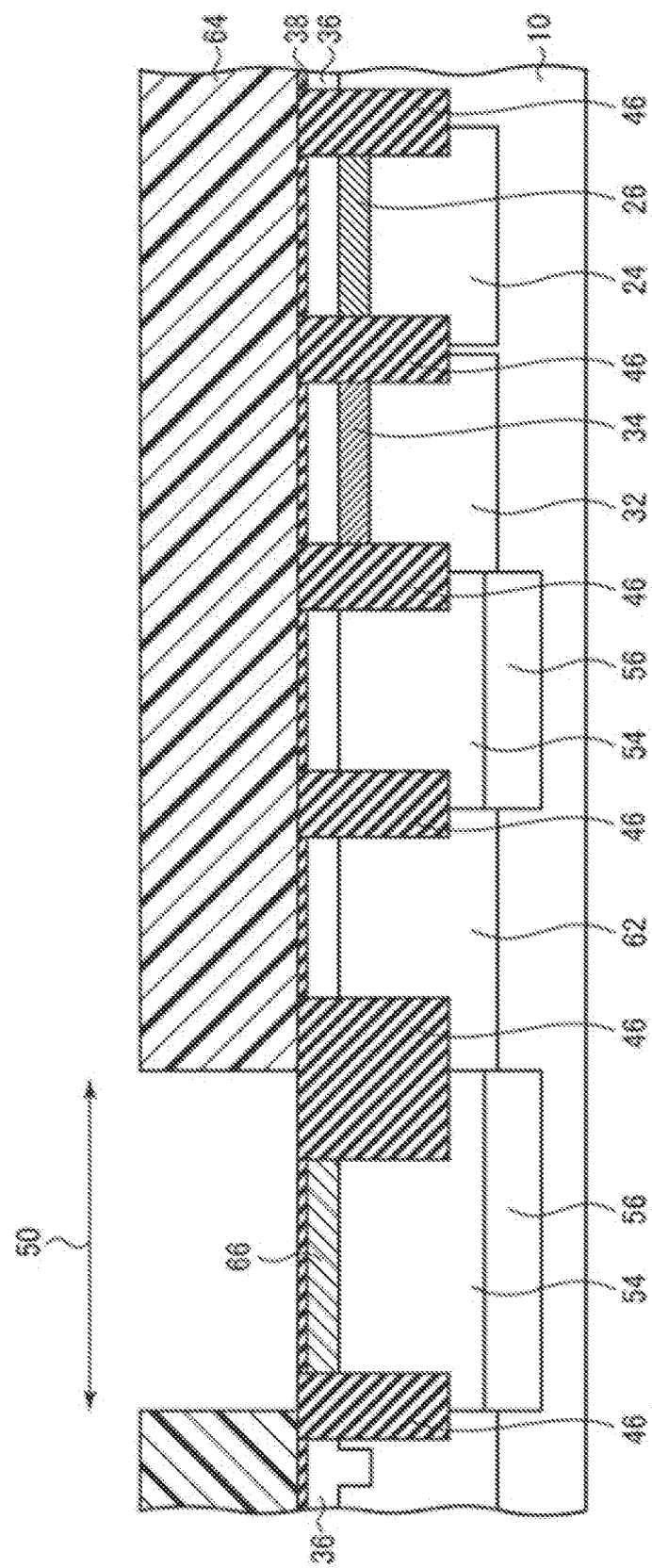
FIG. 20 is a step cross-sectional view illustrating the manufacturing method of the semiconductor device according to one embodiment (part 10)

Next, by using the photoresist film 64 as a mask, ion implantation is performed to form a P-type impurity layer 66 to be a channel impurity layer for threshold voltage control in the memory cell region 50 (FIG. 20).

The P-type impurity layer 66 is formed in a manner that, for example, boron ions are ion-implanted under a condition of an acceleration energy of 15 keV and a dose amount of $5.0 \times 10^{13}$ cm$^{-2}$.

Next, by ashing, for example, the photoresist film 64 is removed.

Next, by wet etching using a hydrofluoric acid aqueous solution, for example, the silicon oxide film 38 is removed.

Next, the surface of the epitaxial silicon layer 36 is thermally oxidized in a wet atmosphere to form a tunnel gate insulating film 68 made of a silicon oxide film having a film thickness of 10 nm, for example, on the surface of the epitaxial silicon layer 36. The formation of the tunnel gate insulating film 68 is performed on the condition that, for example, a temperature is 750° C., a nitrogen flow rate is 5.28 slm, an oxygen flow rate is 4.8 slm, a hydrogen flow rate is 0.264 slm, a pressure is atmospheric pressure, and a time is 65 minutes.

Incidentally, high film thickness controllability is needed for the formation of the tunnel gate insulating film 68, so that not a LPRO method but a wet oxidation method is used.

Next, above the silicon substrate 10 where the tunnel gate insulating film 68 is formed, a polysilicon film 70 having had phosphorus added thereto is deposited by a CVD method, for example.

Next, by photolithography, a photoresist film 72 for patterning of the polysilicon film 70 to be a floating gate 102 is formed.

Figure 21:
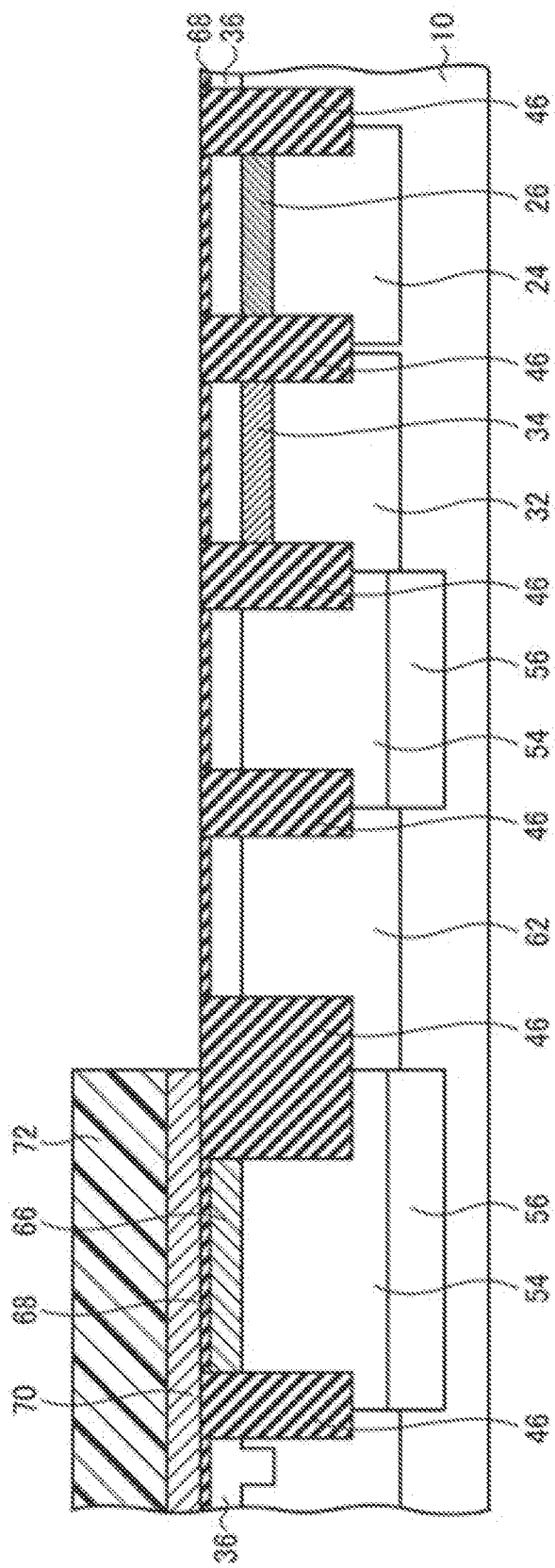
FIG. 21 is a step cross-sectional view illustrating the manufacturing method of the semiconductor device according to one embodiment (part 11)
Figure 22:
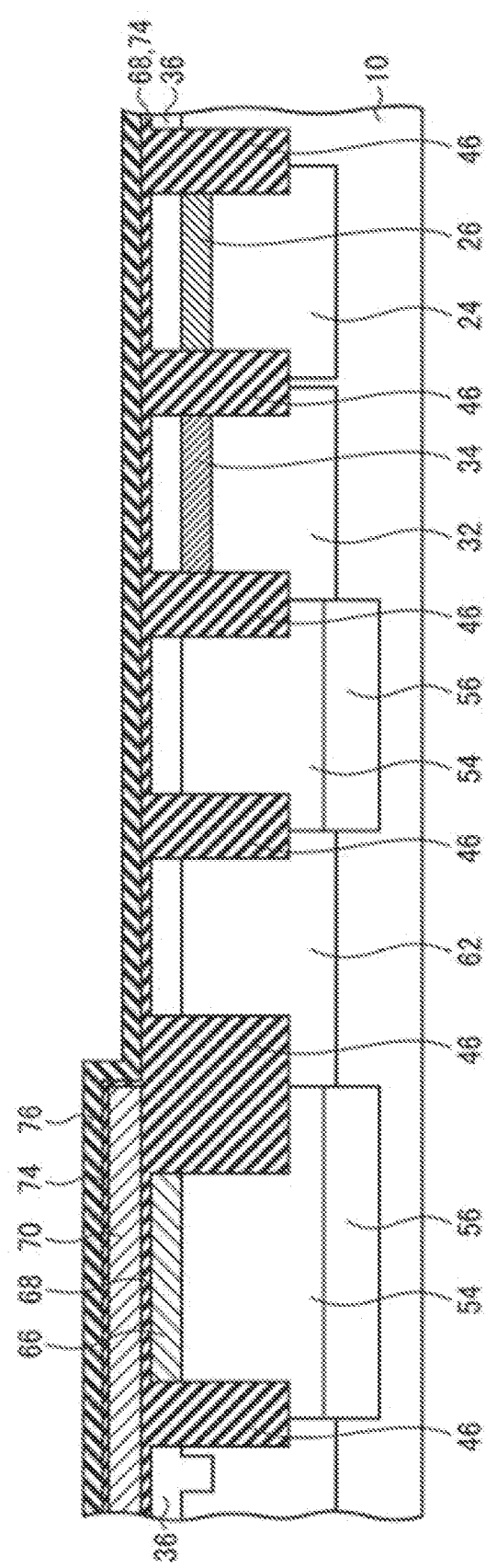
FIG. 22 is a step cross-sectional view illustrating the manufacturing method of the semiconductor device according to one embodiment (part 12)

Next, by using the photoresist film 72 as a mask, the polysilicon film 70 is patterned and the polysilicon film 70 except for the polysilicon film 70 in the memory cell region is removed, and preliminary processing for isolating the floating gate in the adjacent memory transistor is performed (FIG. 21).

Next, by ashing, for example, the photoresist film 72 is removed.

Next, on the whole surface, a silicon oxide film 74 having a film thickness of 5 nm, for example, is deposited by a low-pressure CVD method, for example. A film forming temperature is set to 750° C., for example.

Next, on the silicon oxide film 74, a silicon nitride film 76 having a film thickness of 10 nm, for example, is deposited by a low-pressure CVD method, for example.

Figure 23:
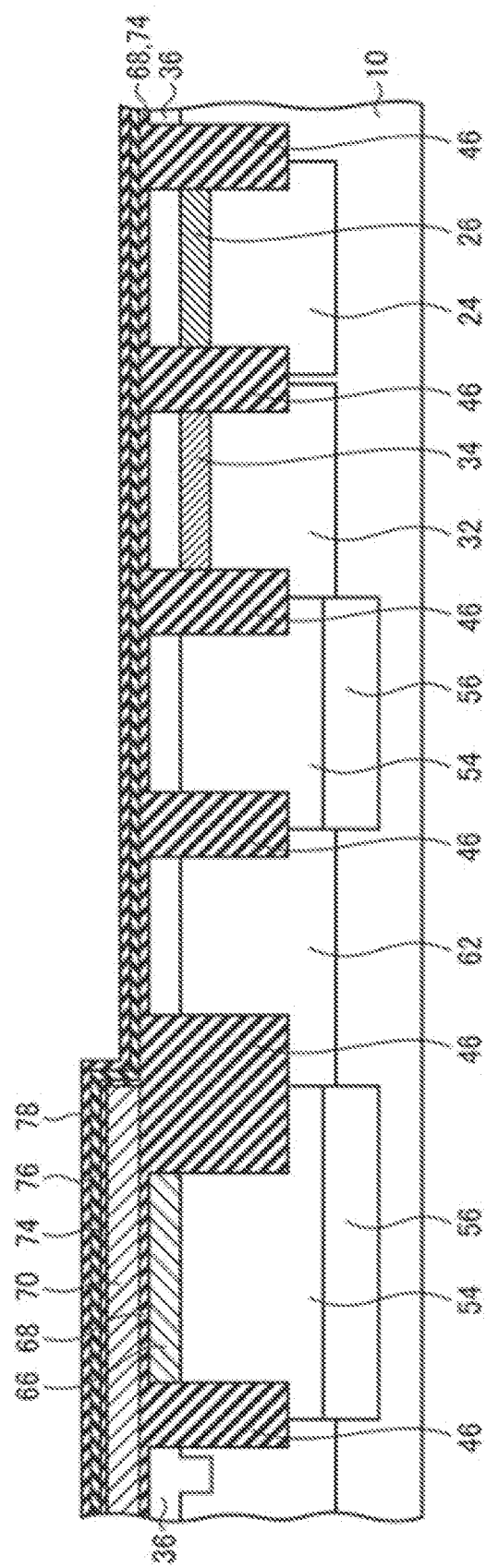
FIG. 23 is a step cross-sectional view illustrating the manufacturing method of the semiconductor device according to one embodiment (part 13)

Next, by a LPRO method, the surface of the silicon nitride film 76 is oxidized to form a silicon oxide film 78 having a film thickness of 5 nm, for example (FIG. 23). Its oxidation condition is set that, for example, a temperature is 750° C., an oxygen flow rate is 7 slm, a hydrogen flow rate is 3 slm, a pressure is 0.95 Torr, and a time is 30 minutes. Using the LPRO method makes it possible to decrease the oxidation temperature down to about 750° C. or lower and to suppress diffusion of impurities in the DDC transistor portions.

Incidentally, in order to grow a silicon oxide film having the same film thickness by normal wet oxidation, an oxidation time necessary for the growth of about 240 nm in terms of conversion of film thickness on silicon is needed even when oxidation is performed at 950° C., resulting in that it is impossible to suppress diffusion of impurities in the DDC transistor portions.

Incidentally, a stacked film (an ONO film) of the silicon oxide film 78/the silicon nitride film 76/the silicon oxide film 74 formed in this manner becomes an inter-gate insulating film of the memory transistor.

Next, by photolithography, a photoresist film 80 exposing the high-voltage NMOS transistor region 52 is formed.

Figure 24:
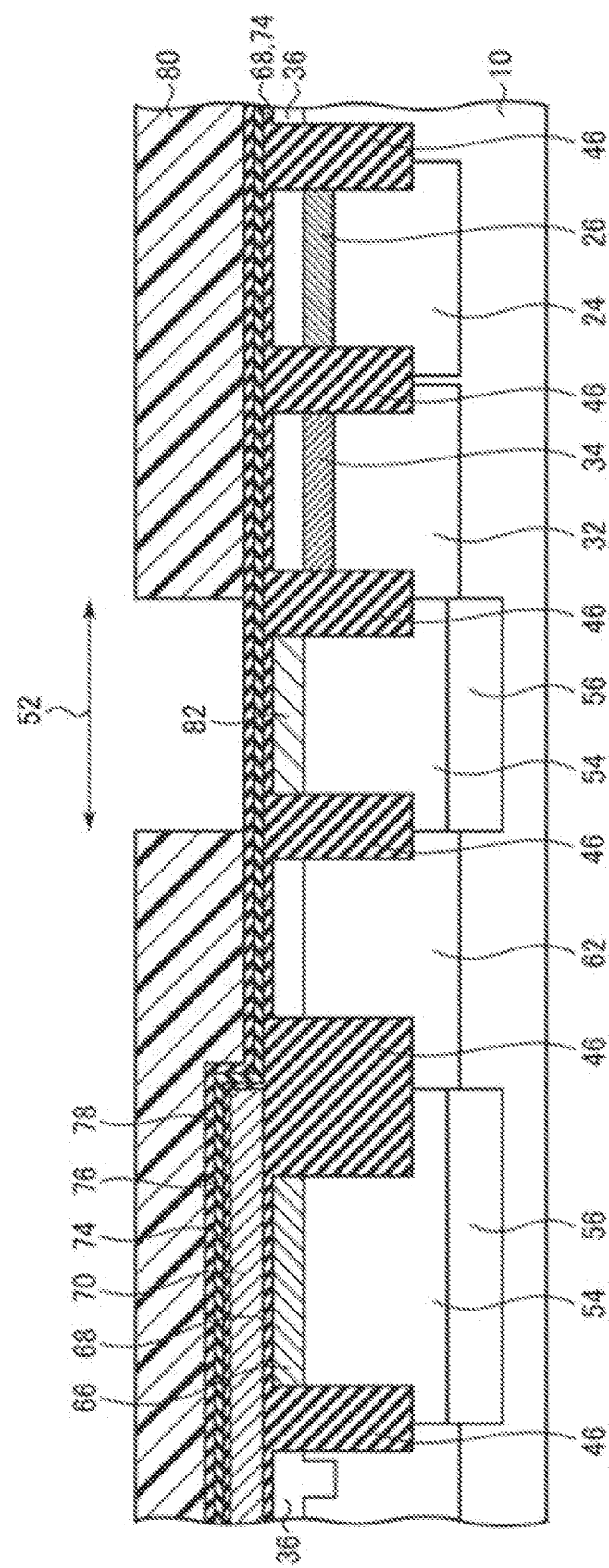
FIG. 24 is a step cross-sectional view illustrating the manufacturing method of the semiconductor device according to one embodiment (part 14)

Next, by using the photoresist film 80 as a mask, ion implantation is performed to form a P-type impurity layer 82 to be a channel impurity layer for threshold voltage control in the high-voltage NMOS transistor region 52 (FIG. 24). The P-type impurity layer 82 is formed in a manner that, for example, boron ions are ion-implanted under a condition of an acceleration energy of 10 keV and a dose amount of $1.5 \times 10^{12}$ cm$^{-2}$.

Next, by ashing, for example, the photoresist film 80 is removed.

Next, by photolithography, a photoresist film 84 exposing the high-voltage PMOS transistor region 60 is formed.

Figure 25:
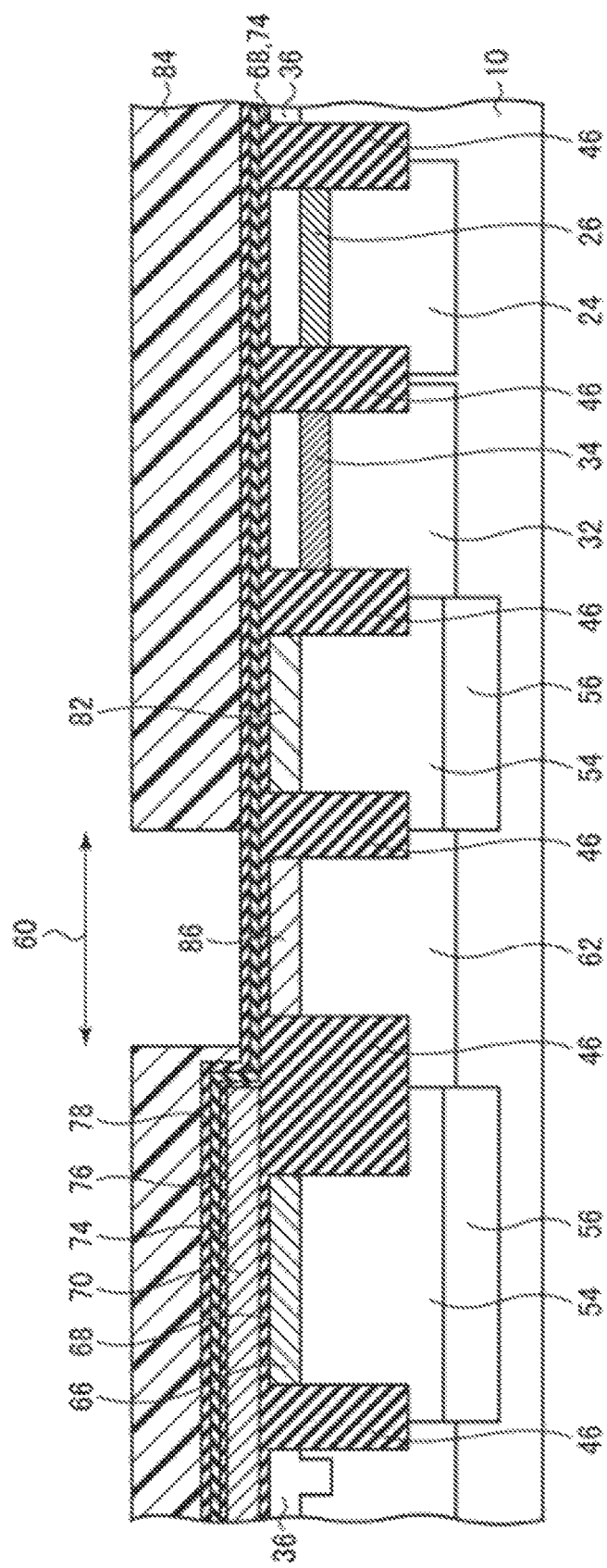
FIG. 25 is a step cross-sectional view illustrating the manufacturing method of the semiconductor device according to one embodiment (part 15)

Next, by using the photoresist film 84 as a mask, ion implantation is performed to form an N-type impurity layer 86 to be a channel impurity layer for threshold voltage control in the high-voltage PMOS transistor region 60 (FIG. 25). The N-type impurity layer 86 is formed in a manner that, for example, phosphorus ions are ion-implanted under a condition of an acceleration energy of 25 keV and a dose amount of $1.6 \times 10^{12}$ cm$^{-2}$.

Next, by ashing, for example, the photoresist film 84 is removed.

Next, by photolithography, a photoresist film 88 covering the memory cell region and exposing the high-voltage transistor regions and the DDC transistor regions is formed.

Figure 26:
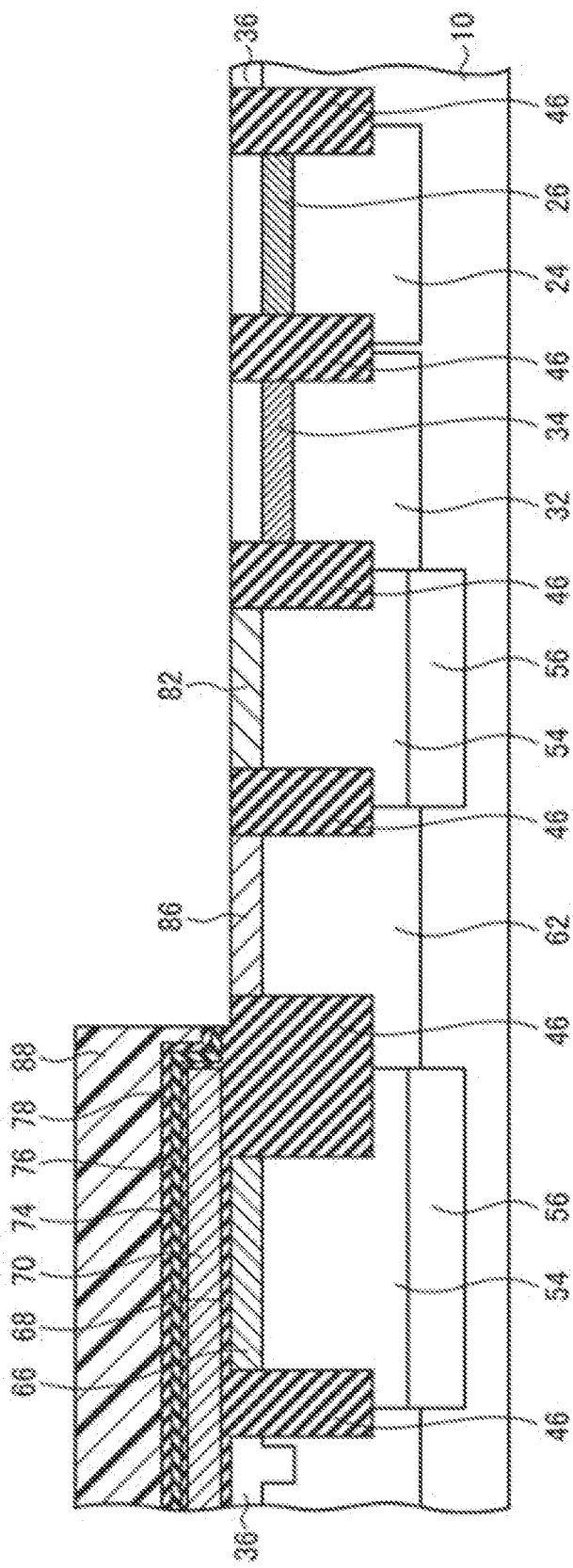
FIG. 26 is a step cross-sectional view illustrating the manufacturing method of the semiconductor device according to one embodiment (part 16)

Next, by using the photoresist film 88 as a mask, the silicon oxide film 78, the silicon nitride film 76, and the silicon oxide films 74 and 68 are etched to remove the ONO film in the high-voltage transistor regions and the DDC transistor regions (FIG. 26).

Next, the surface of the epitaxial silicon layer 36 is thermally oxidized in a wet atmosphere to form a silicon oxide film 90a having a film thickness of 10 nm, for example, on the surface of the epitaxial silicon layer 36. The formation of the silicon oxide film 90a is performed on the condition that, for example, a temperature is 750° C., a nitrogen flow rate is 5.28 slm, an oxygen flow rate is 4.8 slm, a hydrogen flow rate is 0.264 slm, a pressure is atmospheric pressure, and a time is 65 minutes.

Incidentally, for the formation of the silicon oxide film 90a to be a gate insulating film later, high film thickness controllability is needed, so that not a LPRO method but a wet oxidation method is used.

Next, by photolithography, a photoresist film 92 exposing the DDC transistor regions and covering the other regions is formed.

Figure 27:
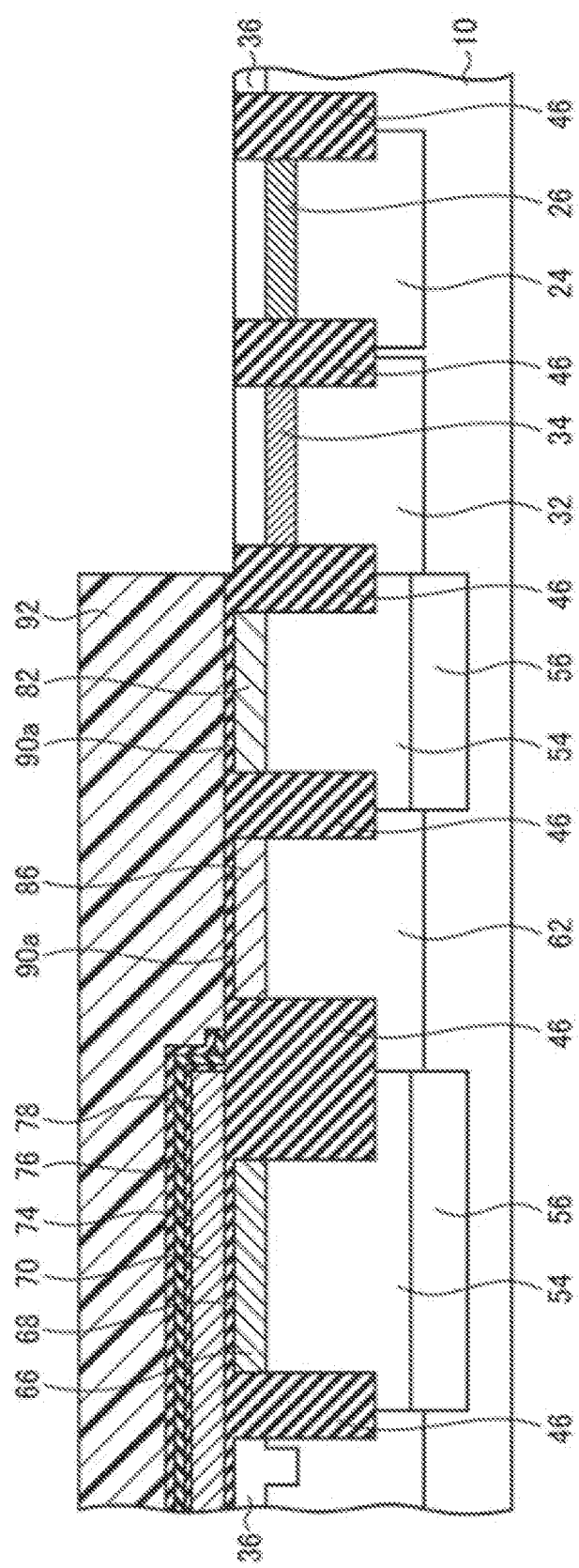
FIG. 27 is a step cross-sectional view illustrating the manufacturing method of the semiconductor device according to one embodiment (part 17)

Next, by wet etching using a hydrofluoric acid aqueous solution, for example, the silicon oxide film 90a is etched by using the photoresist film 92 as a mask. Thereby, the silicon oxide film 90a in the DDC transistor regions is removed (FIG. 27).

Next, by ashing, for example, the photoresist film 92 is removed.

Figure 28:
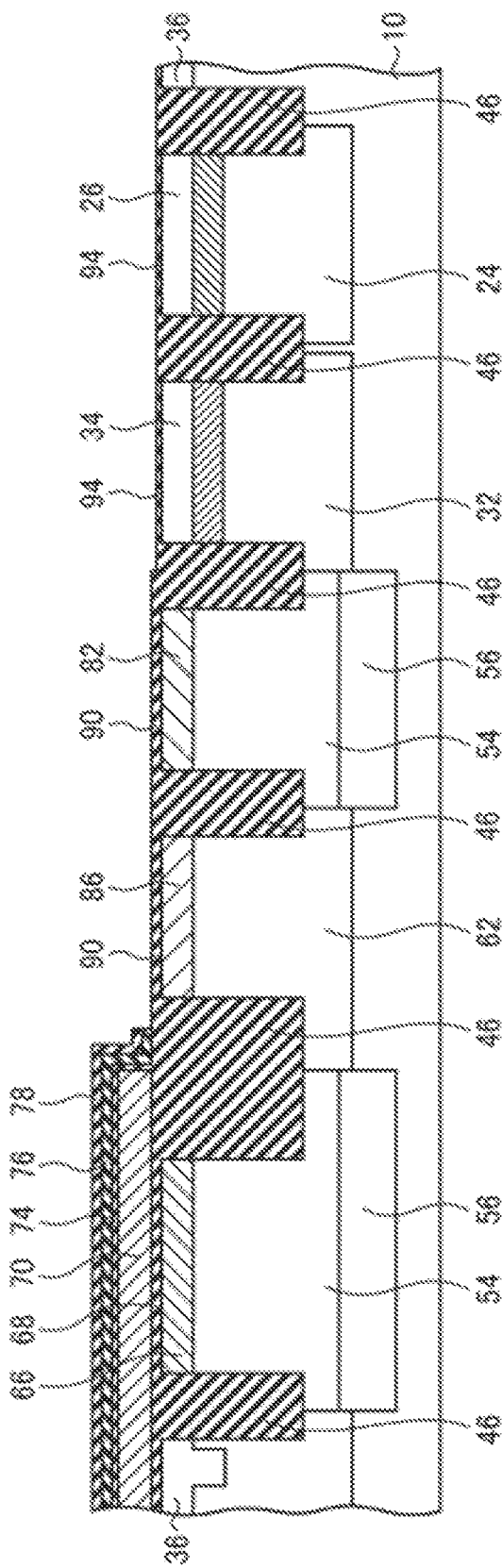
FIG. 28 is a step cross-sectional view illustrating the manufacturing method of the semiconductor device according to one embodiment (part 18)

Next, by an ISSG method, for example, the surface of the epitaxial silicon layer 36 is wet-oxidized under reduced pressure. Thereby, in the DDC transistor regions, a gate insulating film 94 made of a silicon oxide film having a film thickness of 2 nm, for example, is formed, and the silicon oxide film 90a is additionally oxidized to form a gate insulating film 90 (FIG. 28). Its processing condition is set that, for example, a temperature is 810° C. and a time is 20 seconds. Here, the processing time of this wet oxidation is 20 seconds, which is a short time, so that an effect of fluctuations of the threshold voltage of the DDC transistor is in an ignorable range.

Incidentally, the oxidation step when the gate insulating films 90 and 94 are formed is a normal process of the DDC transistor, and the oxidation condition of the gate insulating film forming process of the DDC transistor can be used as it is.

Next, in an inert gas atmosphere, short-time thermal oxidation at 1050° C. for 1 second is performed, for example. Here, the processing time of this thermal processing is 1 second, which is a short time, so that an effect of fluctuations of the threshold voltage of the DDC transistor is in an ignorable range.

Next, on the whole surface, a non-doped polysilicon film 96 having a film thickness of 100 nm, for example, is deposited by a low-pressure CVD method, for example. Its processing condition is set that a temperature is 605° C., for example.

Figure 29:
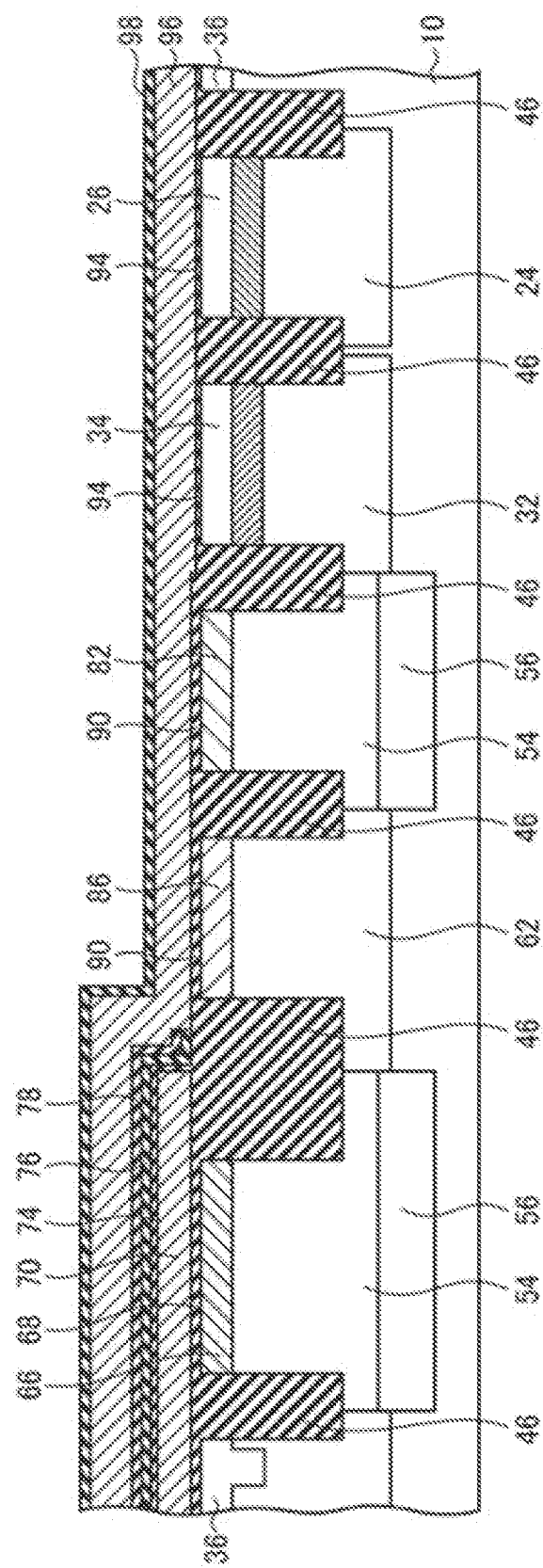
FIG. 29 is a step cross-sectional view illustrating the manufacturing method of the semiconductor device according to one embodiment (part 19)

Next, on the polysilicon film 96, a silicon nitride film 98 having a film thickness of 50 nm, for example, is deposited by a plasma CVD method, for example (FIG. 29).

Next, by photolithography, a photoresist film 100 having a gate pattern of the memory transistor in the memory cell region and covering the other regions is formed.

Figure 30:
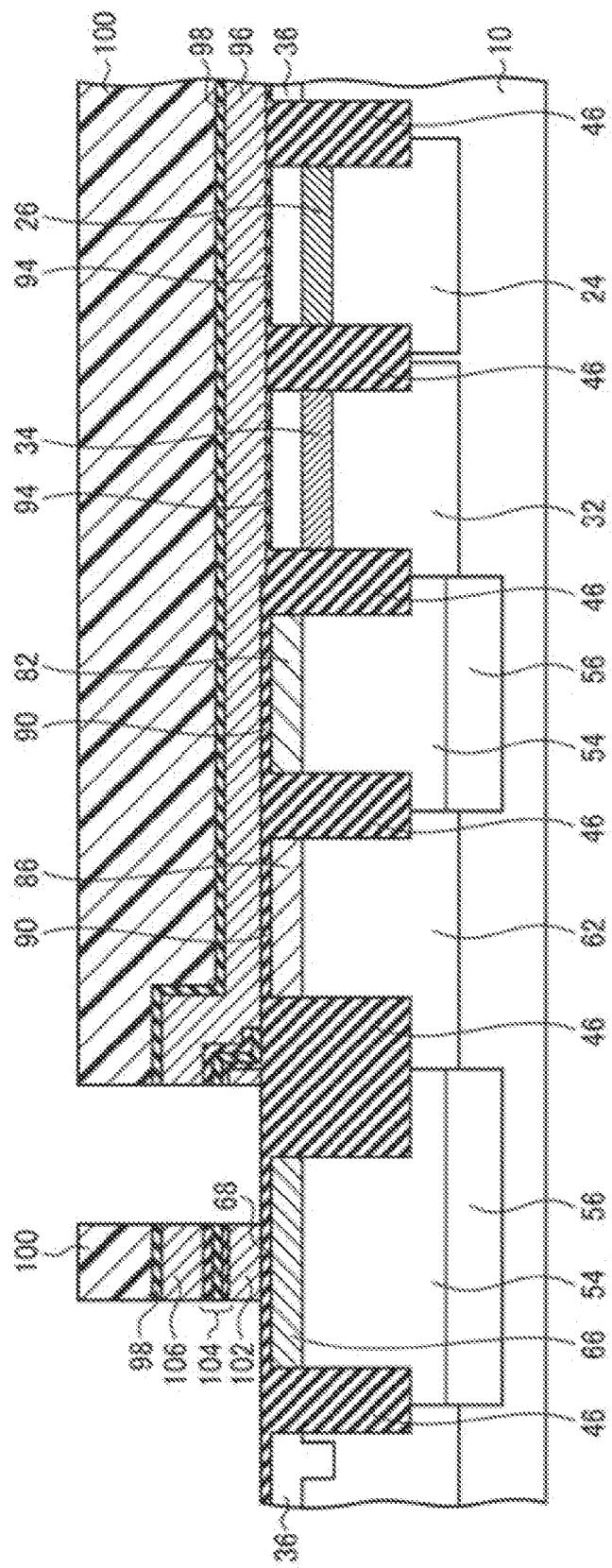
FIG. 30 is a step cross-sectional view illustrating the manufacturing method of the semiconductor device according to one embodiment (part 20)

Next, by using the photoresist film 100 as a mask, the silicon nitride film 98, the polysilicon film 96, the silicon oxide film 78, the silicon nitride film 76, the silicon oxide film 74, and the polysilicon film 70 are patterned. Thereby, a gate stack structure having the floating gate 102 made of the polysilicon film 70, the ONO film 104, the control gate 106 made of the polysilicon film 96, and the silicon nitride film 98 is formed in the memory cell region. The ONO film 104 is a stacked film of the silicon nitride film 74, the silicon nitride film 76, and the silicon oxide film 78 (FIG. 30).

Next, by ashing, for example, the photoresist film 100 is removed.

Figure 31:
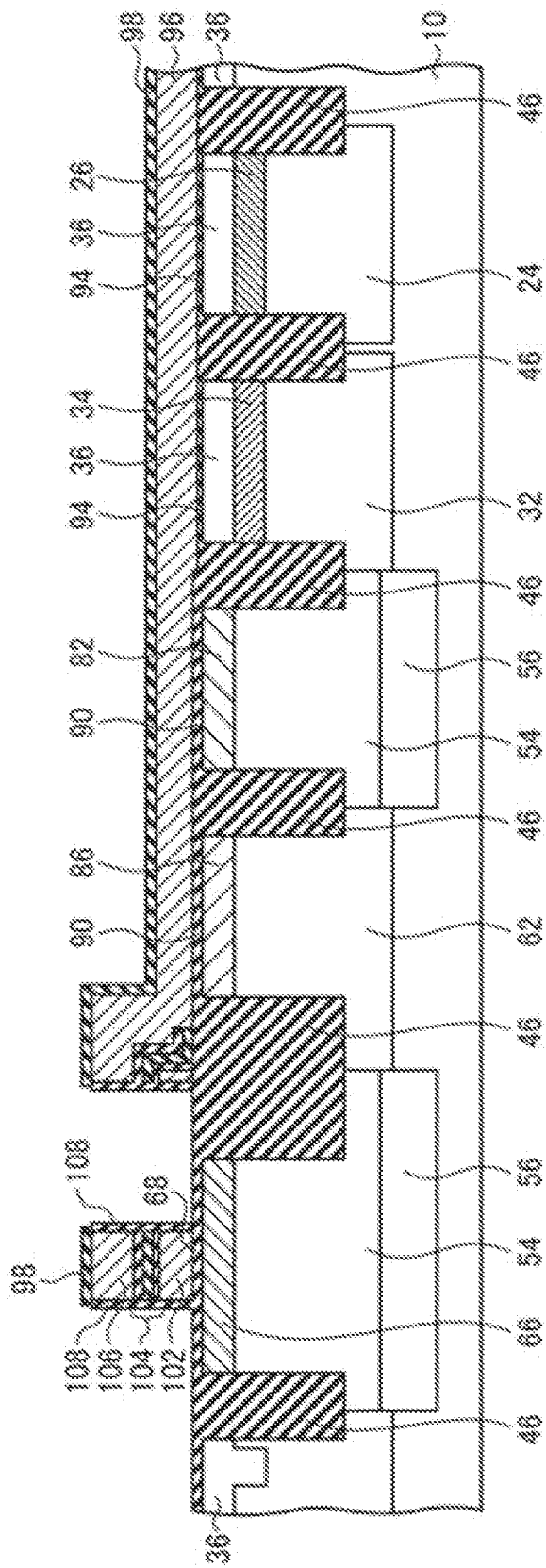
FIG. 31 is a step cross-sectional view illustrating the manufacturing method of the semiconductor device according to one embodiment (part 21)

Next, by a LPRO method, sidewall portions of the gate stack structure are oxidized to form a silicon oxide film 108 having a film thickness of 10 nm, for example (FIG. 31). Its oxidation condition is set that, for example, a temperature is 750° C., an oxygen flow rate is 7 slm, a hydrogen flow rate is 3 slm, a pressure is 0.95 Torr, and a time is 45 minutes. Using the LPRO method makes it possible to decrease the oxidation temperature down to about 750° C. or lower and to suppress diffusion of impurities in the DOC transistor portions.

Next, by photolithography, a photoresist film 110 exposing the memory cell region and covering the other regions is formed.

Figure 32:
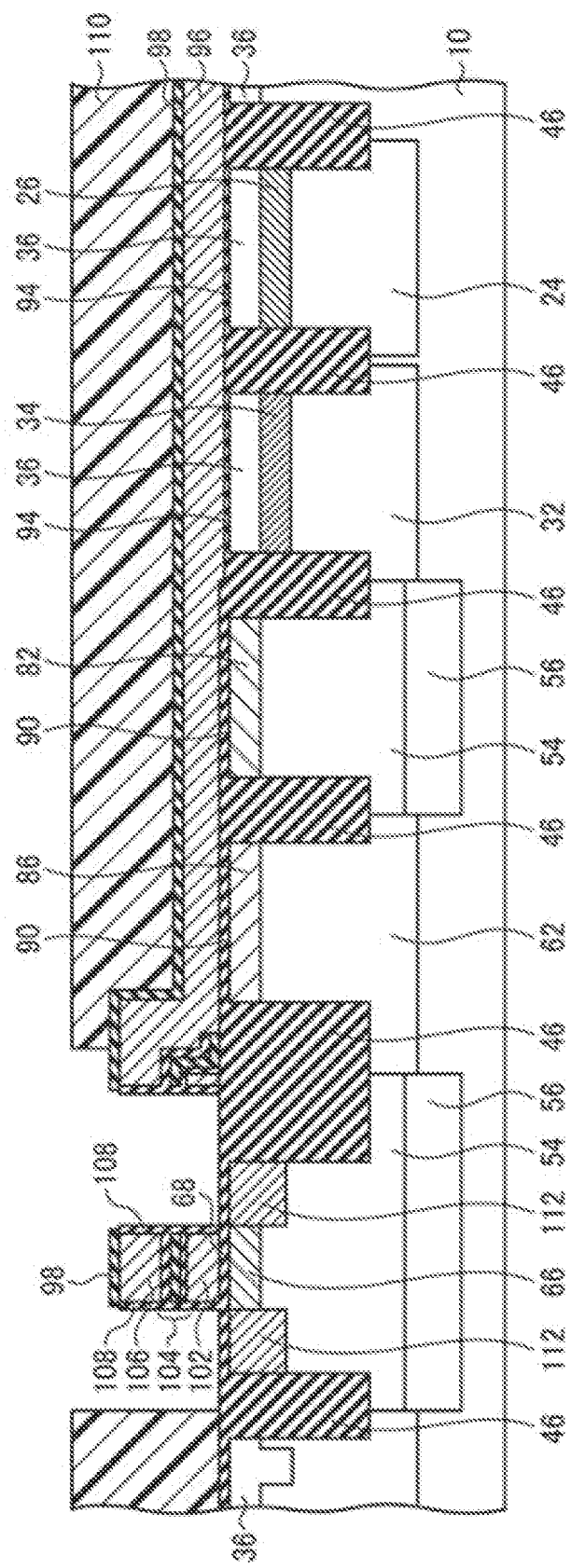
FIG. 32 is a step cross-sectional view illustrating the manufacturing method of the semiconductor device according to one embodiment (part 22)

Next, by using the photoresist film 110 and the gate stack structure as a mask, ion implantation is performed to form N-type impurity layers 112 to be source/drain regions in the memory cell region (FIG. 32). The N-type impurity layers 112 are formed in a manner that, for example, arsenic ions are ion-implanted under a condition of an acceleration energy of 90 keV and a dose amount of $6 \times 10^{14}$ cm$^{-2}$.

Next, by ashing, for example, the photoresist film 110 is removed.

Next, by a LPRO method, the sidewall portions of the gate stack structure are oxidized by 10 nm or so again. Its oxidation condition is set that, for example, a temperature is 750° C., an oxygen flow rate is 7 slm, a hydrogen flow rate is 3 slm, a pressure is 0.95 Torr, and a time is 45 minutes. Using the LPRO method makes it possible o decrease the oxidation temperature down to about 750° C. or lower and to suppress diffusion of impurities in the DDC transistor portions. Incidentally, in the drawing, the silicon oxide film formed by the two oxidations is also illustrated as the silicon oxide film 108.

Next, by a low-pressure CVD method, for example, a silicon nitride film is deposited.

Figure 33:
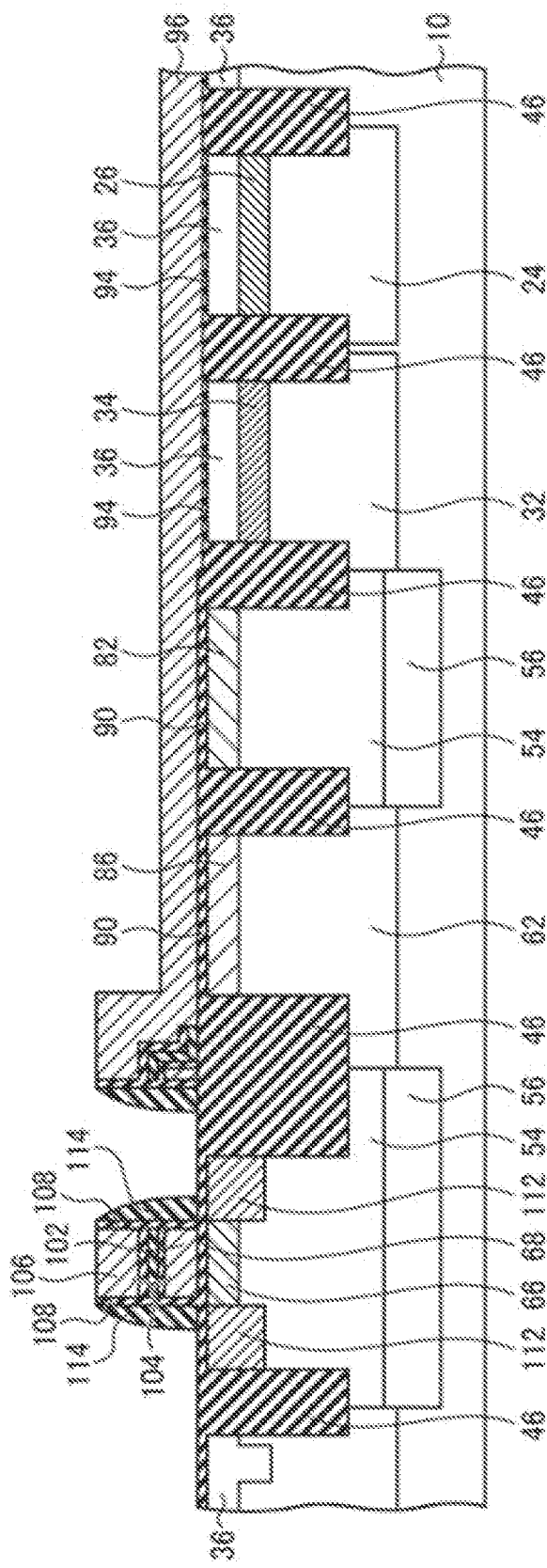
FIG. 33 is a step cross-sectional view illustrating the manufacturing method of the semiconductor device according to one embodiment (part 23)

Next, this silicon nitride film and the silicon nitride film 98 are anisotropically etched to form a sidewall insulating film 114 made of the silicon nitride film on the sidewall portions of the gate stack structure (FIG. 33).

Next, by photolithography, a photoresist film 116 having a gate pattern in the DDC transistor regions and the high-voltage transistor regions and covering the memory cell region is formed.

Figure 34:
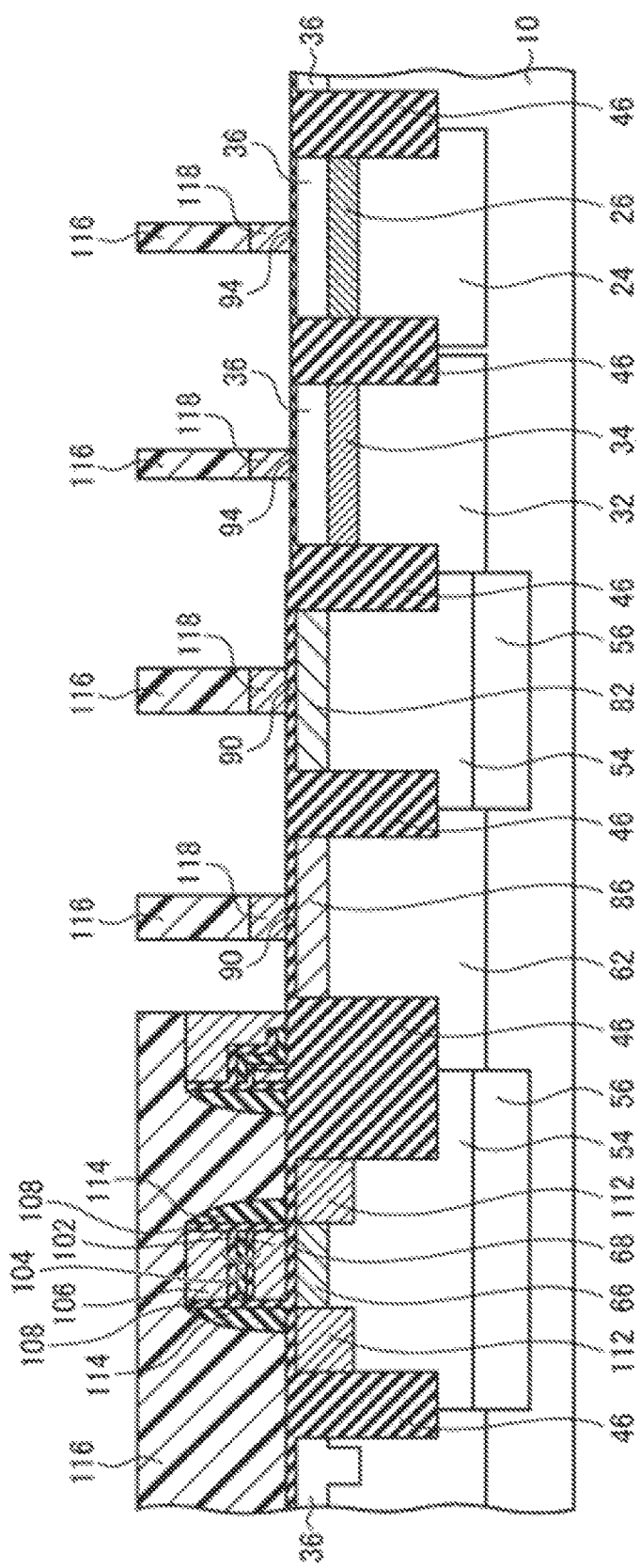
FIG. 34 is a step cross-sectional view illustrating the manufacturing method of the semiconductor device according to one embodiment (part 24)

Next, by using the photoresist film 116 as a mask, the polysilicon film 96 is patterned to form a gate electrode 118 in the DDC transistor regions and the high-voltage transistor regions (FIG. 34).

Next, by ashing, for example, the photoresist film 116 is removed.

Figure 35:
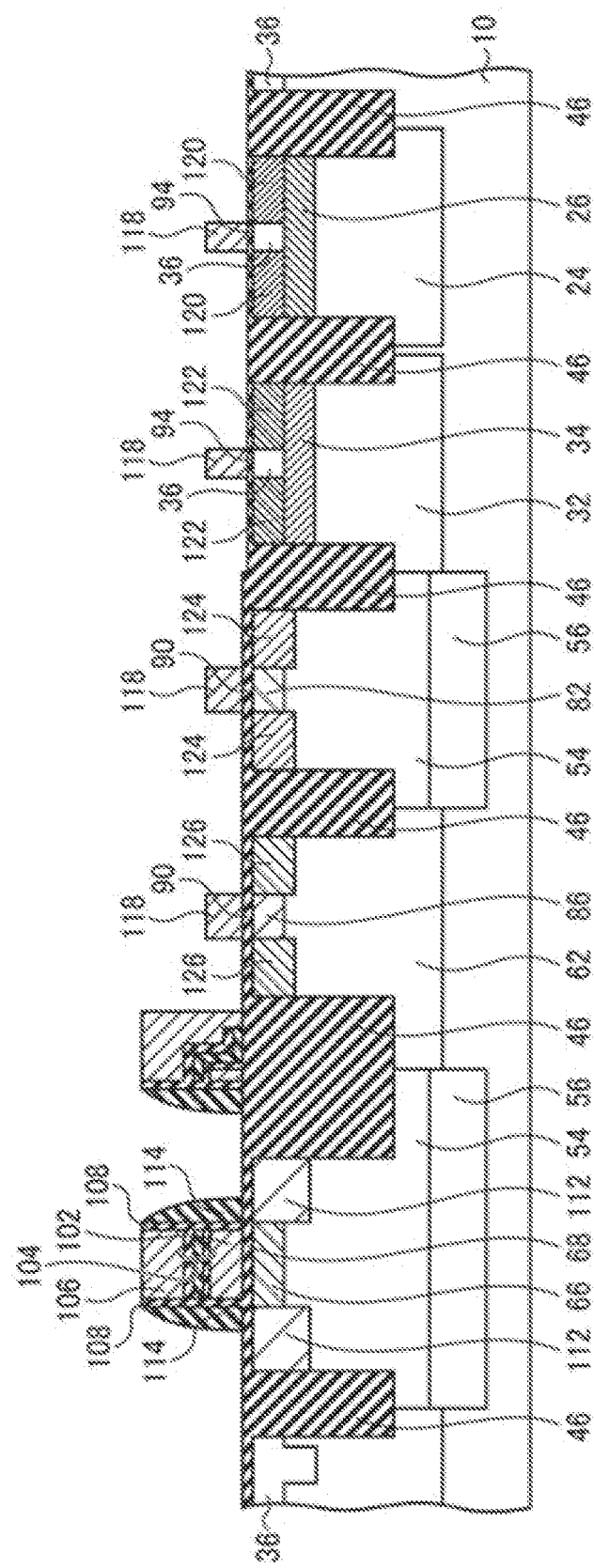
FIG. 35 is a step cross-sectional view illustrating the manufacturing method of the semiconductor device according to one embodiment (pact 25)

Next, by photolithography and ion implantation, N-type impurity layers 120 to be LDD regions are formed in the DDC-NMOS transistor region. Further, by photolithography and ion implantation, P-type impurity layers 122 to be LDD regions are formed in the DDC-PMOS transistor region. Further, by photolithography and ion implantation, N-type impurity layers 124 to be LDD regions are formed in the high-voltage NMOS transistor region. Further, by photolithography and ion implantation, P-type impurity layers 126 to be LDD regions are formed in the high-voltage PMOS transistor region (FIG. 35).

Next, by a low-pressure CVD method, for example, a silicon oxide film is deposited.

Figure 36:
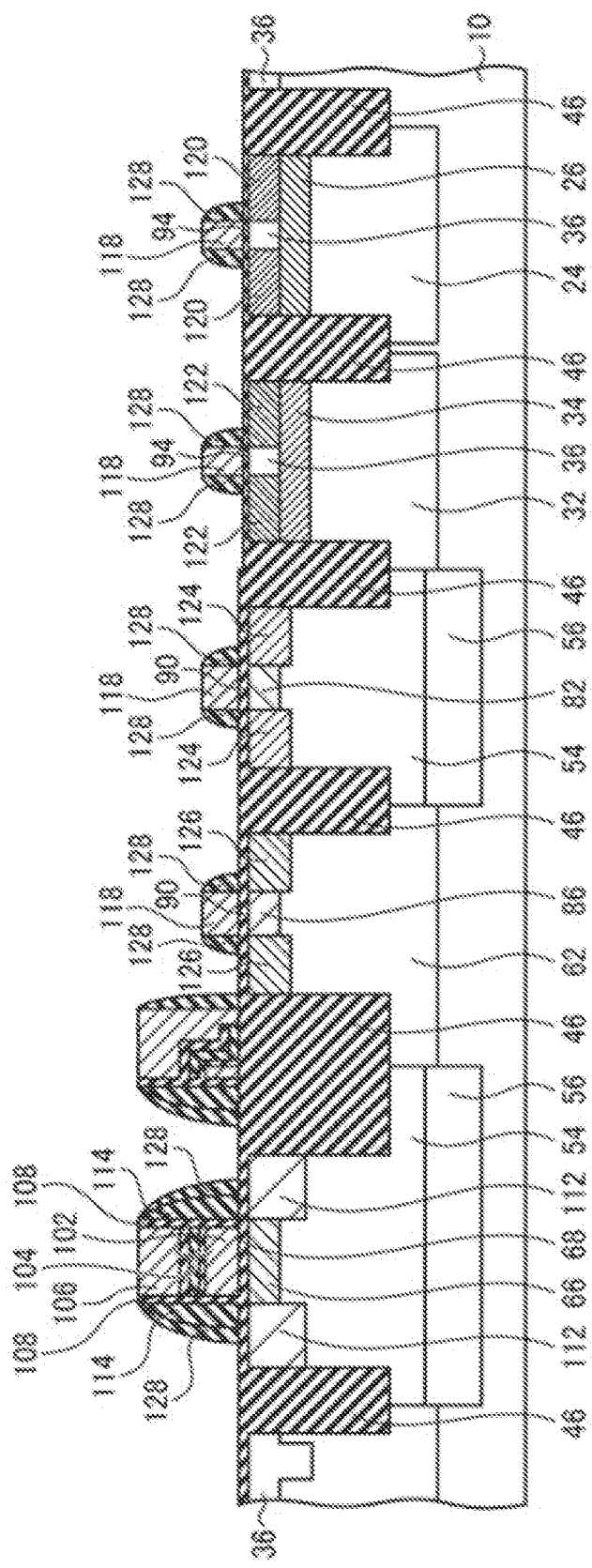
FIG. 36 is a step cross-sectional view illustrating the manufacturing method of the semiconductor device according to one embodiment (part 26)

Next, this silicon oxide film is anisotropically etched to form a sidewall insulating film 128 made of the silicon oxide film on the sidewall portions of the gate stack structure of the memory transistor and sidewall portions of the gate electrodes 118 (FIG. 36).

Figure 37:
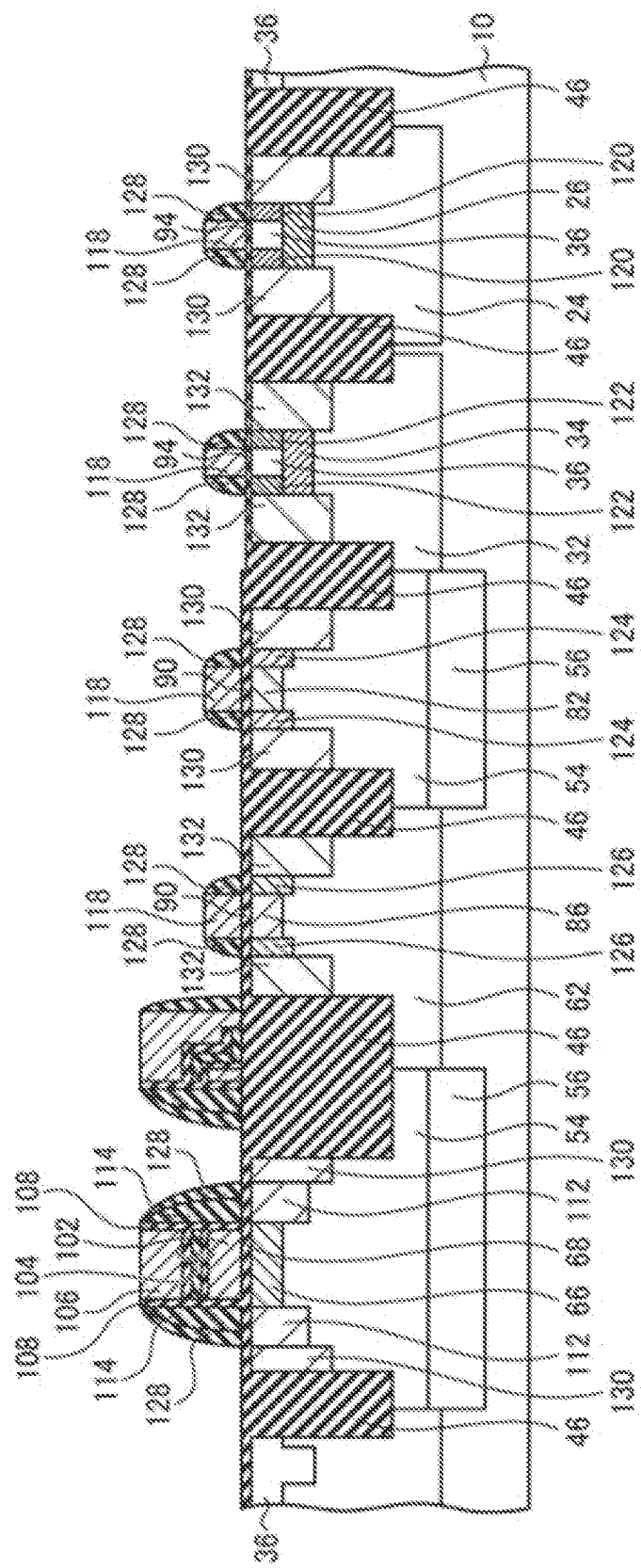
FIG. 37 is a step cross-sectional view illustrating the manufacturing method of the semiconductor device according to one embodiment (part 27)

Next, by photolithography and ion implantation, N-type impurity layers 130 to be source/drain regions are formed in the DDC-NMOS transistor region, the high-voltage NMOS transistor region, and the memory cell region. Further, by photolithography and ion implantation, P-type impurity layers 132 to be source/drain regions are formed in the DDC-PMOS transistor region and the high-voltage PMOS transistor region (FIG. 37).

The N-type impurity layers 130 are formed in a manner that, for example, phosphorus ions are ion-implanted under a condition of an acceleration energy of 8 keV and a dose amount of $8.0 \times 10^{15}$ cm$^{-2}$. Further, the P-type impurity layers 132 are formed in a manner that, for example, boron ions are ion-implanted under a condition of an acceleration energy of 4 keV and a dose amount of $4.0 \times 10^{15}$ cm$^{-2}$.

Next, in an inert gas atmosphere, for example, short-time thermal processing at 1025° C. for 0 second is performed to perform activation of the implanted impurities and perform diffusion of the implanted impurities in the control gate 106 and the gate electrodes 118. Here, the processing time of this thermal processing is a short time, so that an effect of fluctuations of the threshold voltage of the DDC transistor is in an ignorable range.

By this thermal processing, in the DDC-NMOS transistor region, N-type source/drain regions 134 each composed of the N-type impurity layers 120 and 130 are formed. Further, in the DDC-PMOS transistor region, P-type source/drain regions 136 each composed of the P-type impurity layers 122 and 132 are formed. Further, in the high-voltage NMOS transistor region, N-type source/drain regions 138 each composed of the N-type impurity layers 124 and 130 are formed. Further, in the high-voltage PMOS transistor region, P-type source/drain regions 140 each composed of the P-type impurity layers 126 and 132 are formed. Further, in the memory cell region, N-type source/drain regions 142 each composed of the N-type impurity layers 112 and 130 are formed.

Figure 38:
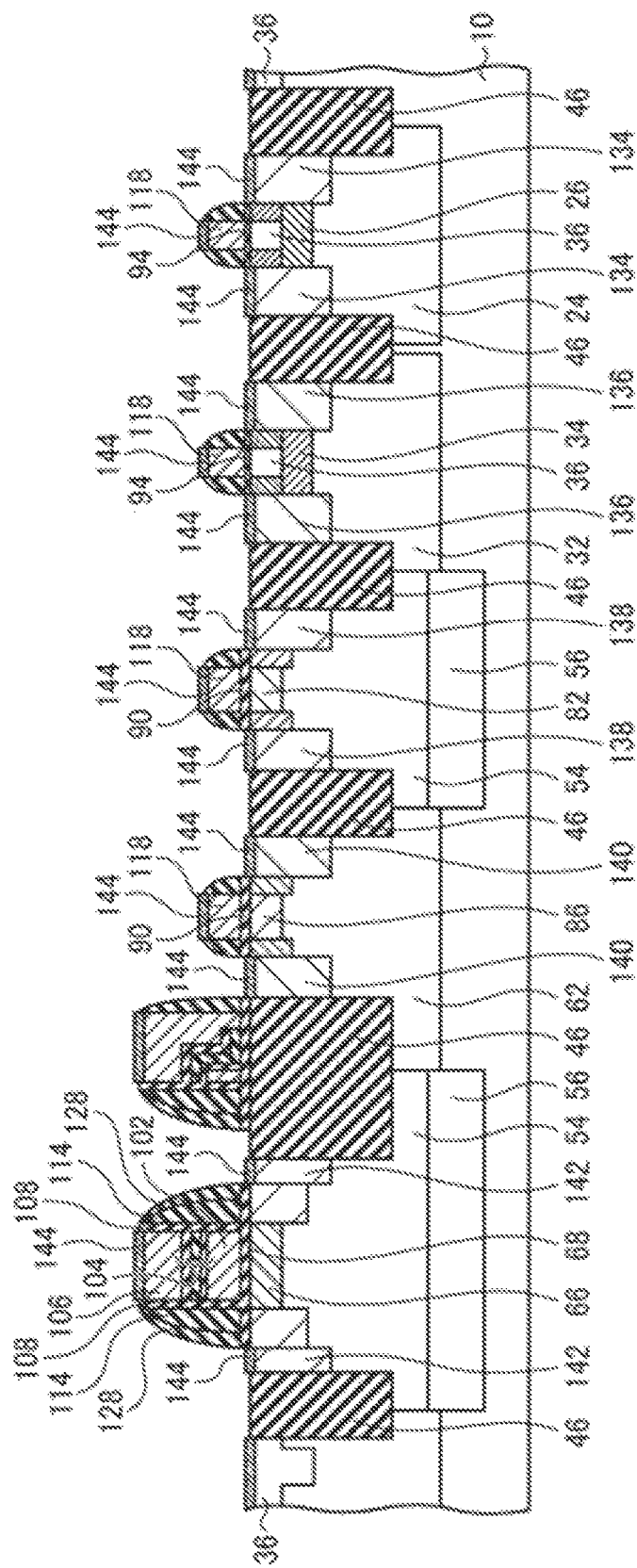
FIG. 38 is a step cross-sectional view illustrating the manufacturing method of the semiconductor device according to one embodiment (part 28)

Next, by a salicide process, a metal silicide film 144 is selectively formed on the control gate 106, on the gate electrodes 118, on the N-type source/drain regions 134, 138, and 142, and on the P-type source/drain regions 136 and 140 (FIG. 38). The metal silicide film 144 is not limited particularly, but, for example, a cobalt silicide film can be applied.

Next, on the whole surface, by a CVD method, for example, a silicon nitride film having a film thickness of 50 nm, for example, is deposited, and a silicon nitride film as an etching stopper film is formed.

Next, on the silicon nitride film, a silicon oxide film having a film thickness of 500 nm, for example, is deposited by a high-density plasma CVD method, for example.

Thereby, an interlayer insulating film 146 being a stacked film of the silicon nitride film and the silicon oxide film is formed.

Next, by a CMP method, for example, the surface of the interlayer insulating film 146 is polished to make the interlayer insulating film 146 flat.

Figure 39:
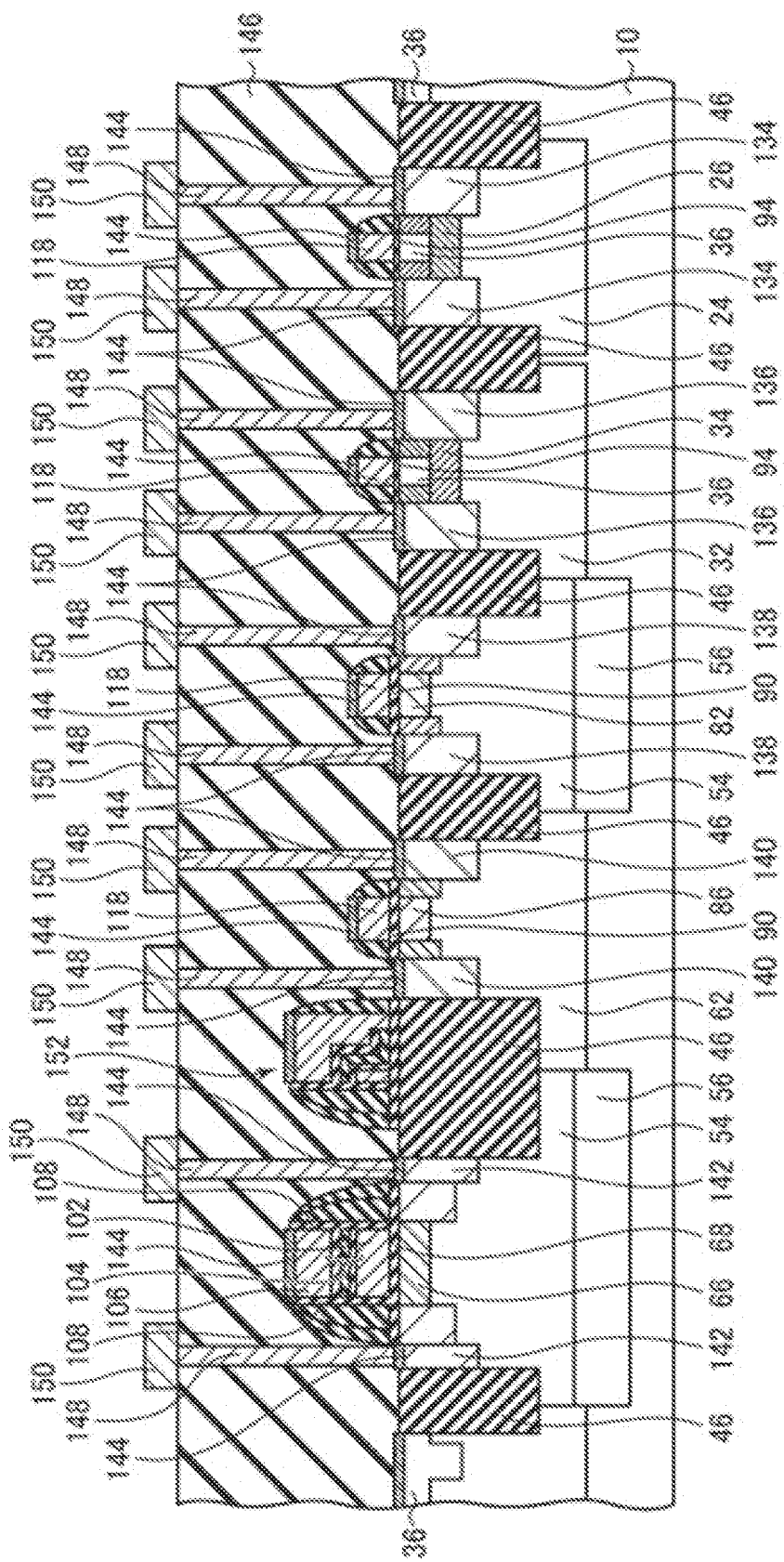
FIG. 39 is a step cross-sectional view illustrating the manufacturing method of the semiconductor device according to one embodiment (part 29).

Next, contact plugs 148 buried in the interlayer insulating film 146, wirings 150 connected to the contact plugs 148, and the like are formed (FIG. 39).

Thereafter, by performing a desired back-end process, the semiconductor device according to this embodiment is completed.

As above, according to this embodiment, it is possible to mixedly mount the DDC transistor and the flash memory transistor without deteriorating properties of these transistors.

Modified Embodiment

Not only the above-described embodiment but also various modifications are possible.

For example, in the above-described embodiment, as the most favorable condition, the forming step of the tunnel gate insulating film 68, the forming step of the gate insulating film 90, the forming step of the silicon oxide film 78, and the forming step of the silicon oxide film 108 are all performed under the low-temperature condition, but they are all not necessarily performed at low temperature. The step to be performed at low temperature may also be selected as necessary while considering the effect on properties of the DDC transistor. For example, the step where oxidation is the most difficult to be performed out of the above-described four steps is the forming step of the silicon oxide film 78, and only this step may also be performed at low temperature.

Further, in the above-described embodiment, the respective thermal oxidation conditions favorable for the forming step of the tunnel gate insulating film 68, the forming step of the gate insulating film 90, the forming step of the silicon oxide film 78, and the forming step of the silicon oxide film 108 have been described as an example, but the thermal oxidation conditions of the respective steps are not limited to these. In view of preventing the effect on properties of the DDC transistor, these thermal oxidation steps only need to be performed at a temperature of 750° C. or lower. The thermal oxidation methods of the above-described respective steps are desirably selected as necessary in a range allowing the flash memory transistor having desired properties to be obtained.

Further, the structure, the constitution materials, the manufacturing conditions, and so on of the semiconductor device described in the above-described embodiment are merely illustrated as one example, and according to the common general technical knowledge and the like of a person skilled in the art, modifications and changes are possible as necessary.

According to the disclosed manufacturing method of the semiconductor device, without deteriorating properties of the DDC transistor and the nonvolatile memory transistor, it is possible to mixedly mount these transistors.

Further, in the above-described embodiment, the flash memory transistor accumulating the charge in the floating gate have been described as an example, but is not limited to thereto. For example, the technique of the above-described embodiment can be applied to a manufacturing method of a so-called SONOS type flash memory transistor accumulating the charge in the silicon nitride film of the ONO film without the gate insulating film and the floating gate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
    forming an impurity layer in a semiconductor substrate, that includes a first region and a second region, of the first region;
    epitaxially growing a silicon layer on the semiconductor substrate of the first region and the second region after forming the impurity layer;
    forming a first silicon oxide film and a silicon nitride film above the semiconductor substrate after epitaxially growing the silicon layer;
    independently introducing oxygen and hydrogen into an oxidation furnace in a reduced pressure state and exposing the silicon nitride film to active species of the oxygen and active species of the hydrogen to oxidize the silicon nitride film to form a second silicon oxide film on the silicon nitride film;
    forming a first gate insulating film on the silicon layer of the first region;
    forming a first conductor layer on the second silicon oxide film and on the first gate insulating film;
    patterning the first conductor layer, the second silicon oxide film, the silicon nitride film and the first silicon oxide film and forming a stack gate of a nonvolatile memory transistor above the second region; and
    patterning the first conductor layer above the first region and forming a gate electrode of an MIS-type transistor.

2. The manufacturing method of the semiconductor device according to claim 1, further comprising:
    forming a tunnel gate insulating film on the silicon layer on the second region; and
    forming a second conductor layer on the tunnel gate insulating film before forming the first silicon oxide film and the silicon nitride layer.

3. The manufacturing method of the semiconductor device according to claim 1, wherein
    the forming the second silicon oxide film is performed at a temperature of 750° C. or lower.

4. The manufacturing method of the semiconductor device according to claim 2, wherein in the forming the tunnel gate insulating film, in an atmospheric pressure state, oxygen and hydrogen are made to react with each other outside the oxidation furnace, to then be introduced into the oxidation furnace to oxidize the silicon layer, to thereby form the second silicon oxide film.

5. The manufacturing method of the semiconductor device according to claim 2, wherein
the forming the tunnel gate insulating film is performed at a temperature of 750° C. or lower.

6. The manufacturing method of the semiconductor device according to claim 1, wherein
the semiconductor substrate further includes a third region, the manufacturing method of the semiconductor device further comprising:
after the forming the second silicon oxide film and before the forming the first gate insulating film, forming a second gate insulating film above the semiconductor substrate of the second region and the third region by, in an atmospheric pressure state, oxygen and hydrogen being made to react with each other outside the oxidation furnace to then be introduced into the oxidation furnace to oxidize the silicon layer; and removing the second gate insulating film located in the second region.

7. The manufacturing method of the semiconductor device according to claim 6, wherein
the forming the second gate insulating film is performed at a temperature of 750° C. or lower.

8. The manufacturing method of the semiconductor device according to claim 1, further comprising:
oxidizing the stack gate and forming a third silicon oxide film on sidewall portions of the stack gate after the forming the stack gate and before the forming the gate electrode.

9. The manufacturing method of the semiconductor device according to claim 8, wherein
in the forming the third silicon oxide film, in a reduced pressure state, oxygen and hydrogen are independently introduced into an oxidation furnace and active elements of the oxygen and the hydrogen are exposed to a surface of a silicon nitride film, to thereby form the third silicon oxide film.

10. The manufacturing method of the semiconductor device according to claim 8, wherein
the forming the third silicon oxide film is performed at a temperature of 750° C. or lower.

11. The manufacturing method of the semiconductor device according to claim 1, wherein
forming the second silicon oxide film is performed in a batch processing manner.

12. A manufacturing method of a semiconductor device, comprising:
forming an impurity layer in a semiconductor substrate, that includes a first region and a second region, of the first region;
epitaxially growing a silicon layer on the semiconductor substrate of the first region and the second region after forming the impurity layer;
forming a first silicon oxide film and a silicon nitride film above the semiconductor substrate after epitaxially growing the silicon layer;
oxidizing the silicon nitride film at a temperature of 750° C. or lower and forming a second silicon oxide film on the silicon nitride film;
forming a first gate insulating film on the silicon layer of the first region;
forming a first conductor layer on the second silicon oxide film and on the first gate insulating film;
patterning the first conductor layer, the second silicon oxide film, the silicon nitride film, and the first silicon oxide film and forming a stack gate of a nonvolatile memory transistor above the second region; and
patterning the first conductor layer above the first region and forming a gate electrode of an MIS-type transistor.

13. The manufacturing method of the semiconductor device according to claim 12, further comprising:
oxidizing the silicon layer at a temperature of 750° C. or lower and forming a tunnel gate insulating film on the silicon layer on the second region; and
forming a second conductor layer on the tunnel gate insulating film before forming the first silicon oxide film and the silicon nitride film.

14. The manufacturing method of the semiconductor device according to claim 12, wherein
the semiconductor substrate further includes a third region, the manufacturing method of the semiconductor device further comprising:
after the forming the second silicon oxide film and before the forming the first gate insulating film, oxidizing the silicon layer at a temperature of 750° C. or lower to form a second gate insulating film on the silicon layer of the second region and on the silicon layer of the third region; and removing the second gate insulating film located in the second region.

15. The manufacturing method of the semiconductor device according to claim 12, further comprising:
oxidizing the stack gate at a temperature of 750° C. or lower and forming a third silicon oxide film on sidewall portions of the stack gate after the forming the stack gate and before the forming the gate electrode.

* * * * *